(12) United States Patent
Makihara et al.

(10) Patent No.: US 7,898,020 B2
(45) Date of Patent: Mar. 1, 2011

(54) SEMICONDUCTOR MEMORY, SEMICONDUCTOR MEMORY SYSTEM USING THE SAME, AND METHOD FOR PRODUCING QUANTUM DOTS APPLIED TO SEMICONDUCTOR MEMORY

(75) Inventors: Katsunori Makihara, Higashihiroshima (JP); Seiichi Miyazaki, Higashihiroshima (JP); Seiichiro Higashi, Higashihiroshima (JP)

(73) Assignee: Hiroshima University, Hiroshima (JP)

(*) Notice: Subject to any disclaimer, the term of this patent is extended or adjusted under 35 U.S.C. 154(b) by 68 days.

(21) Appl. No.: 12/523,682

(22) PCT Filed: Dec. 6, 2007

(86) PCT No.: PCT/JP2007/001361
§ 371 (c)(1),
(2), (4) Date: Jul. 17, 2009

(87) PCT Pub. No.: WO2008/087692
PCT Pub. Date: Jul. 24, 2008

(65) Prior Publication Data
US 2010/0006921 A1    Jan. 14, 2010

(30) Foreign Application Priority Data

Jan. 19, 2007 (JP) ................ 2007-009772
Mar. 23, 2007 (JP) ................ 2007-075803
Sep. 12, 2007 (JP) ................ 2007-236635

(51) Int. Cl.
*H01L 29/788* (2006.01)
*H01L 21/3205* (2006.01)

(52) U.S. Cl. ............ 257/321; 257/E21.294; 257/E29.3; 438/584; 438/593

(58) Field of Classification Search ............ 257/321, 257/E29.3, E21.294; 438/584, 593
See application file for complete search history.

(56) References Cited

U.S. PATENT DOCUMENTS

| 5,952,692 A | * | 9/1999 | Nakazato et al. ............ 257/321 |
| 6,060,743 A | * | 5/2000 | Sugiyama et al. ............ 257/321 |
| 6,208,000 B1 | * | 3/2001 | Tanamoto et al. ............ 257/402 |

(Continued)

FOREIGN PATENT DOCUMENTS

JP        09-260611        10/1997

(Continued)

OTHER PUBLICATIONS

International Search Report for PCT/JP2007/001361 dated Mar. 11, 2008 (w/English translation).

(Continued)

*Primary Examiner* — Lex Malsawma
(74) *Attorney, Agent, or Firm* — Foley & Lardner LLP

(57) ABSTRACT

A semiconductor memory includes a composite floating structure where an insulation film is formed on a semiconductor substrate, Si-based quantum dots covered with an extremely thin Si oxide film is formed on the insulation film, silicide quantum dots covered with a high dielectric insulation film are formed on the extremely thin Si oxide film, and Si-based quantum dots covered with a high dielectric insulation film are formed on the high dielectric insulation film. Multivalued memory operations can be conducted at a high speed and with stability by applying a certain positive voltage to a gate electrode to accumulate electrons in the silicide quantum dots and by applying a certain negative voltage and weak light to the gate electrode to emit the electrons from the silicide quantum dots.

11 Claims, 17 Drawing Sheets

U.S. PATENT DOCUMENTS

| | | | |
|---|---|---|---|
| 6,333,214 B1* | 12/2001 | Kim et al. | 438/142 |
| 6,946,346 B2* | 9/2005 | Chae et al. | 438/257 |
| 7,250,653 B2* | 7/2007 | Kim et al. | 257/324 |
| 7,393,745 B2* | 7/2008 | Jeng | 438/257 |
| 7,602,011 B2* | 10/2009 | Sugizaki | 257/324 |
| 2003/0042534 A1* | 3/2003 | Bhattacharyya | 257/317 |
| 2004/0108512 A1* | 6/2004 | Iwata et al. | 257/100 |
| 2005/0045943 A1* | 3/2005 | Lung et al. | 257/325 |
| 2005/0122775 A1* | 6/2005 | Koyanagi et al. | 365/185.11 |
| 2005/0127431 A1* | 6/2005 | Chang et al. | 257/321 |

FOREIGN PATENT DOCUMENTS

| | | |
|---|---|---|
| JP | 2000-040753 | 2/2000 |
| JP | 2000-091451 | 3/2000 |
| JP | 2000-150862 | 5/2000 |
| JP | 2000-164735 | 6/2000 |
| JP | 2003-078050 | 3/2003 |
| JP | 2003-258240 | 9/2003 |
| JP | 2003-347434 | 12/2003 |
| JP | 2004-259986 | 9/2004 |
| JP | 2005-079186 | 3/2005 |
| JP | 2005-268531 | 9/2005 |
| JP | 2005-277263 | 10/2005 |

OTHER PUBLICATIONS

Lee, J.J. et al., "Theoretical and Experimental Investigation of Si Nanocrystal Memory Device with $HfO_2$ High-k Tunneling Dielectric," 2003 Symposium on VLSI Technology Digest of Technical Papers, 2003, p. 33.

Makihara, K. et al., "Characterization of Electronic Charged States of Impurity Doped Si Quantum Dots Using AFM/Kelvin Probe Technique," Abstract of IUMRS-ICA-2006, 2006, p. 82.

Darma, Y. et al., "Influence of thermal annealing on compositional mixing and crystallinity of highly selective grown Si dots with Ge core," Applied Surface Science, vol. 224, 2004, pp. 156-159.

Ohba, R. et al., "Nonvolatile Si Quantum Memory With Self-Aligned Doubly-Stacked Dots," IEEE Transactions on Electron Devices, vol. 49, No. 8, Aug. 2002, pp. 1392-1398.

Makihara, K. et al., "Fabrication of Multiply-Stacked Structures of Si Quantum-Dots Embedded in $SiO_2$ by Combination of Low-Pressure CVD and Remote Plasma Treatments," 2004 International Microprocesses and Nanotechnology Conference, Digest of Papers, Oct. 27, 2004, pp. 216-217.

Notice of Reasons for Rejection for JP 2007-236635 mailed Jul. 13, 2010 (with English translation).

* cited by examiner

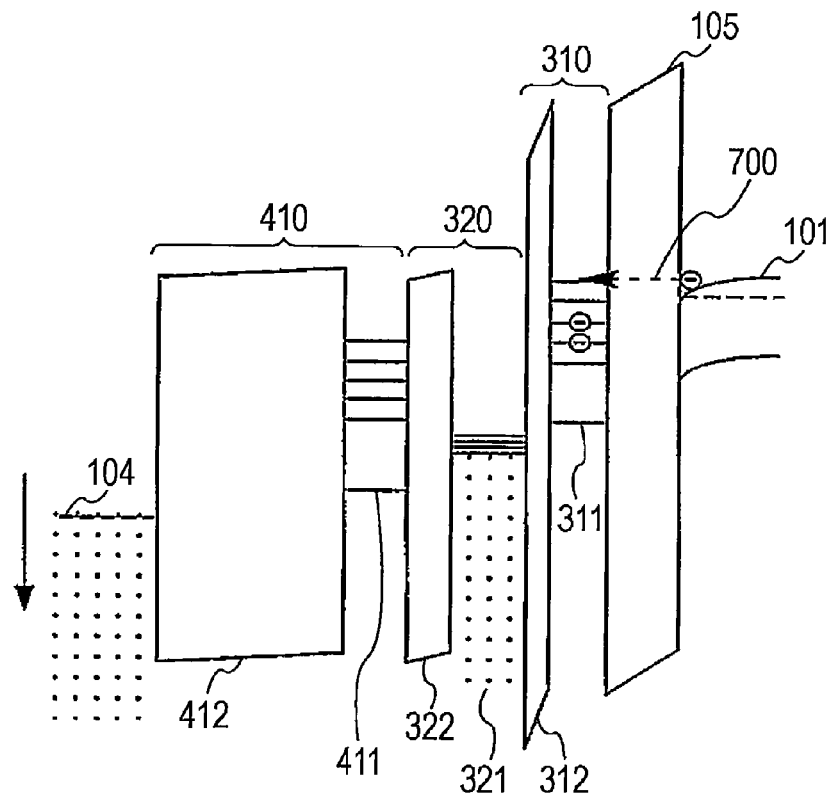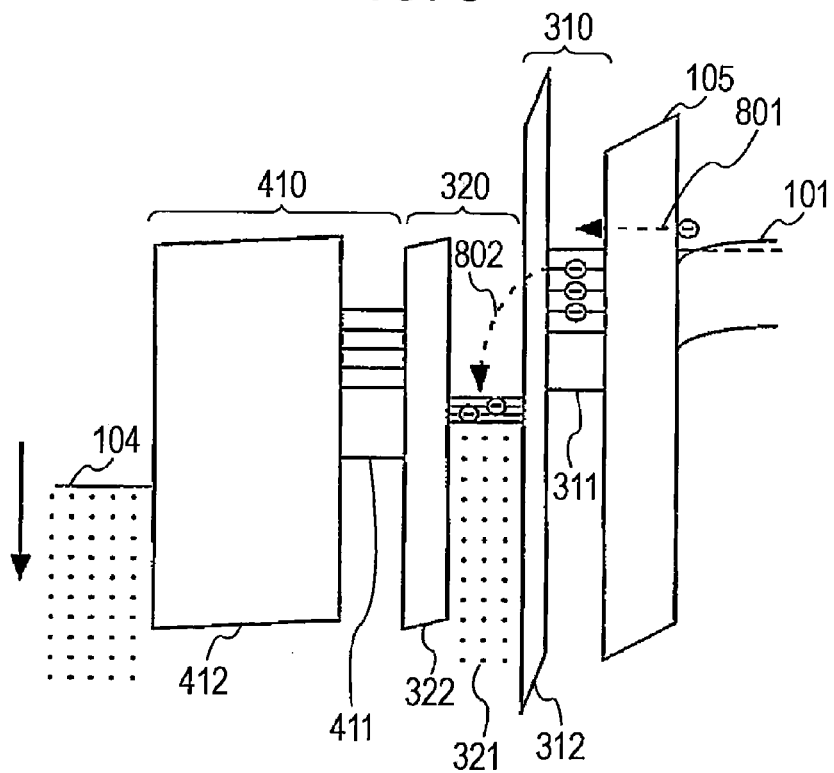

FIG. 13
(a)
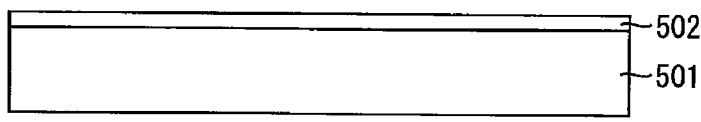
(b)
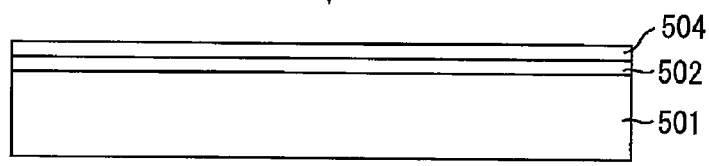
(c)
REMOTE H₂ PLASMA TREATMENT
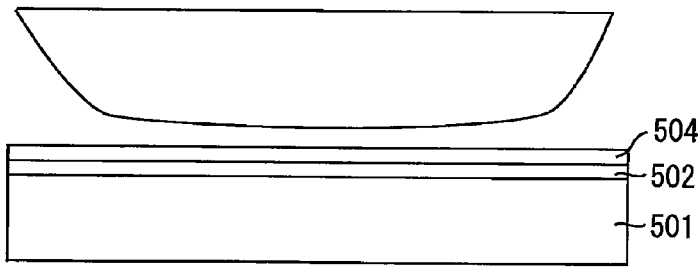
(d)
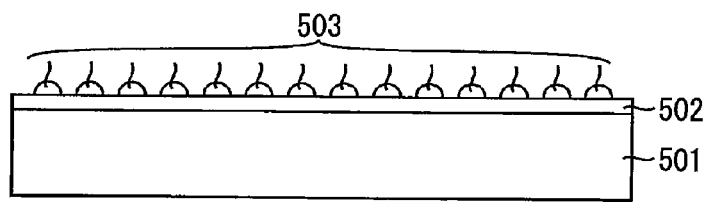
(e)

SEMICONDUCTOR MEMORY, SEMICONDUCTOR MEMORY SYSTEM USING THE SAME, AND METHOD FOR PRODUCING QUANTUM DOTS APPLIED TO SEMICONDUCTOR MEMORY

CROSS-REFERENCE TO RELATED PATENT APPLICATIONS

The present application claims priority as a national stage application of International Application No. PCT/JP2007/001361 filed on Dec. 6, 2007, which claims the benefit of priority to Japanese Application No. 2007-009772, filed Jan. 19, 2007, to Japanese Application No. 2007-075803, filed Mar. 23, 2007, and to Japanese Application No. 2007-236635, filed Sep. 12, 2007, the entire contents of each of which are incorporated herein by reference in their entireties.

The present disclosure relates to a semiconductor memory, a semiconductor memory system using such a semiconductor memory, and a method for producing quantum dots applied to a semiconductor memory. In particular, the present disclosure relates to a semiconductor memory including a composite floating gate structure, a semiconductor memory system using such a semiconductor memory, and a method for producing quantum dots applied to a semiconductor memory.

BACKGROUND

Hereinafter, a description is given with reference to FIGS. 1 and 2. Like element numerals are used to denote like elements in FIGS. 1 and 2.

FIG. 1 shows an image of use of a semiconductor memory by a user and the basic configuration of a semiconductor memory. A semiconductor memory, in particular, a non-volatile memory, is used as non-volatile storage means for an audio player 2 being carried by a user 1, a digital camera, or the like. For example, the audio player 2 contains a semiconductor integrated circuit 3 including a non-volatile memory for storing music data or the like. The semiconductor integrated circuit 3 is constituted by a combination of a plurality of transistors 4.

The transistors 4 are fabricated on a single crystal semiconductor substrate or a single crystal semiconductor thin film on an insulator. The transistors 4 are constituted by memory cells such as a plurality of field effect transistors (FET, hereinafter, simply referred to as transistors).

The basic configuration of the transistor 4 is as follows. A source electrode 102 and a drain electrode 103 are provided on a semiconductor substrate 101 (silicon material). An insulation film 105 is formed on the source electrode 102 and the drain electrode 103. A layer 107 composed of a certain semiconductor material is formed on the insulation film 105. An insulation film 108 is formed on the layer 107. A gate electrode 104 is formed on the insulation film 108. Side walls 106 are further formed on the insulation film 105 to sandwich the layer 107 composed of a certain semiconductor material, the insulation film 108, and the gate electrode 104. These components are integrated to constitute the transistor 4.

Conventionally, higher speed and higher packing density of the semiconductor integrated circuit 3 have been achieved by reducing the size of the transistors 4. This results in larger storage capacity per unit area and the like and hence more advanced information processing has been achieved.

However, such a reduction in size has physical limits and it will be difficult to substantially provide higher performance by simply reducing the size of the transistors 4. In particular, when a fabrication process is conducted at an accuracy on the order of nanometers, the limits become obvious.

With the recent trend toward higher performance in information communications equipment, non-volatile memories capable of storing data without receiving power have become widely used and there is an increasing demand for higher storage capacity for such memories. There is also a demand for higher input/output speed of the memory for the purpose of handling a large data stream (moving image data or the like).

Products using semiconductor memories such as the audio player 2 have high competitiveness because large data can be input and output at high speed in spite of the small size of the products.

To overcome the above-described problem, that is, to store more data per unit area and to update a memory at high speed, a technique of multi-valuing a memory device has been developed. However, in conventional multi-valuing techniques, there is a trade-off between a decrease in time for which electrons are injected and an increase in time for which charges are retained, that is, between the reading/writing speed of a memory and memory retention time. For this reason, it is difficult to provide a high-performance memory device having both a large capacity and high input/output speed, which has been a problem.

To overcome this problem, a technique has been disclosed in which the layer 107 composed of a certain semiconductor material is constituted by a floating gate (Japanese Unexamined Patent Application Publication No. 09-260611). Hereinafter, a conventional floating gate structure is described with reference to FIG. 2. FIG. 2 is a section view of a conventional semiconductor memory having a floating gate.

A floating gate 200 is constituted by a laminate of a plurality of nodes. Each node has a configuration where a plurality of quantum dots composed of a certain material are covered with an insulation film composed of a certain material. These nodes can be categorized on the basis of function into a control node for controlling injection and emission of electrons and a charge accumulation node for accumulating electrons.

The floating gate 200 described in Japanese Unexamined Patent Application Publication No. 09-260611 is constituted by a laminate of a control node 210 and a charge accumulation node 220. The control node 210 and the charge accumulation node 220 are constituted by silicon quantum dots of the same type and insulation films of the same type. A plurality of silicon quantum dots in the control node 210 are regularly arranged to correspond to one unit of silicon quantum dots in the charge accumulation node 220.

According to this technique, the threshold voltage of a transistor is controlled by injecting electrons into silicon quantum dots, thereby making the transistor function as a multivalued memory. Use of such a transistor permits expression of multiple values such as 0, 1, 2, and 3, which is different from conventional memory operations using binary values of 0 and 1. As a result, the storage capacity of a memory can be increased while the area of possession in the device remains the same and this memory can also achieve a certain level of input/output speed.

DISCLOSURE

In the technique disclosed in Japanese Unexamined Patent Application Publication No. 09-260611, quantum dots contained in the control node 210 and the charge accumulation node 220 are composed of a silicon-based material, which constitutes the semiconductor substrate 101. For this reason, when electrons are retained in such quantum dots, charging energy increases the potential of the quantum dots and hence the energy levels of the quantum dots become higher than the conduction band of the semiconductor substrate 101. As a result, the electrons accumulated in the quantum dots are emitted to the semiconductor substrate 101 at a certain probability of tunneling. Thus, the efficiency with which electrons are accumulated is not good. In summary, the technique has a first problem in that electrons accumulated in the charge accumulation node 220 tend to be emitted to the semiconductor substrate 101 and hence stable storing operations are not expected.

This technique also has a second problem as follows. The technique requires regular arrangement of silicon quantum dots such that a plurality of silicon quantum dots in the control node 210 correspond to one unit of silicon quantum dots in the charge accumulation node 220. This requirement makes the production difficult.

At least one embodiment described herein provides a semiconductor memory including a composite floating gate structure having good charge accumulation efficiency.

At least one embodiment described herein provides a semiconductor memory system using a semiconductor memory including a composite floating gate structure having good charge accumulation efficiency.

At least another embodiment described herein provides a method for producing quantum dots applied to a semiconductor memory including a composite floating gate structure having good charge accumulation efficiency.

At least another embodiment described herein provides a method for producing quantum dots in which metal quantum dots can be produced by simple processes.

A semiconductor memory according to a representative embodiment includes a floating gate structure and includes a charge accumulation node and a control node. The charge accumulation node includes first quantum dots and accumulates electrons. The control node includes second quantum dots and performs injection of electrons into and/or emission of electrons from the charge accumulation node. The charge accumulation node is composed of a material different from a material of the control node such that energy levels of the first quantum dots for electrons are lower than energy levels of the second quantum dots for electrons.

The control node includes first and second control nodes and the charge accumulation node be provided between the first control node and the second control node.

The charge accumulation node includes the first quantum dots and a first coating material covering the first quantum dots; the control node include the second quantum dots and a second coating material covering the second quantum dots; the first quantum dots be composed of a material different from a material of the second quantum dots; and the first coating material be composed of a material different from a material of the second coating material.

The first quantum dots include Si—Ge-based quantum dots, and the second quantum dots include metal silicide quantum dots.

The first quantum dots may include metal quantum dots, and the second quantum dots include metal silicide quantum dots.

The metal quantum dots may be composed of a metal having an electron affinity higher than an electron affinity of a semiconductor substrate on which the charge accumulation node and the control node are formed.

A semiconductor memory system according to a representative embodiment includes a semiconductor memory and a light source. The semiconductor memory includes a floating gate structure. The light source irradiates light to the semiconductor memory. The semiconductor memory includes a floating gate and a gate electrode. The floating gate includes a charge accumulation node that has first quantum dots and accumulates electrons and the control node that has second quantum dots and performs injection of electrons into and/or emission of electrons from the charge accumulation node. The gate electrode is of the light-transmissive type and guides light from the light source to the charge accumulation node. The charge accumulation node is composed of a material different from a material of the control node such that energy levels of the first quantum dots for the electrons are lower than energy levels of the second quantum dots for the electrons.

A method for producing quantum dots used for a semiconductor memory including a floating gate structure according to an embodiment includes a first step of forming an oxide film on a semiconductor substrate; a second step of depositing a metal thin film on the oxide film; and a third step of subjecting the metal thin film to a heating treatment or a remote hydrogen plasma treatment.

In the third step, the remote hydrogen plasma treatment may be conducted while the semiconductor substrate is electrically floated.

In the second step, the metal thin film having an electron affinity higher than an electron affinity of the semiconductor substrate may be deposited on the oxide film.

The semiconductor substrate may be composed of silicon, and the metal thin film may be composed of a nickel thin film.

According to a representative embodiment, a method for producing quantum dots used for a semiconductor memory including a floating gate structure includes a first step of forming an oxide film on a semiconductor substrate; a second step of forming quantum dots composed of a semiconductor material on the oxide film; a third step of forming a metal thin film on the quantum dots; and a fourth step of subjecting the metal thin film to a remote hydrogen plasma treatment.

In the fourth step, the remote hydrogen plasma treatment may be conducted while the semiconductor substrate is electrically floated.

In a semiconductor memory according to a representative embodiment, energy levels for electrons in a charge accumulation node are set to be lower than energy levels for electrons in a control node. As a result, the capability of retaining electrons in the charge accumulation node is enhanced.

Thus, according to a representative embodiment, charge accumulation efficiency in a semiconductor memory can be enhanced. Since the capability of retaining electrons in a charge accumulation node is enhanced, the thickness of an insulation film between a semiconductor substrate and a control node can be reduced. Therefore, memory writing and memory erasing at a high speed can be conducted.

In a method for producing quantum dots according to a representative embodiment, metal dots are produced by subjecting a metal thin film to heating or a remote hydrogen plasma treatment.

Thus, according to an embodiment, metal quantum dots can be produced by simple processes.

In a method for producing quantum dots according to a representative embodiment, silicide dots are produced by subjecting a metal thin film formed on quantum dots to a remote hydrogen plasma treatment.

Thus, according to an embodiment, silicide dots can be produced by simple processes.

BRIEF DESCRIPTION OF DRAWINGS

FIG. 7 is a third energy band diagram for describing a memory writing operation and a memory erasing operation in a semiconductor memory.

FIG. 8 is a fourth energy band diagram for describing a memory writing operation and a memory erasing operation in a semiconductor memory.

FIG. 13 is a process chart showing a method for producing the metal quantum dots shown in FIG. 11.

DETAILED DESCRIPTION

Figure 1:
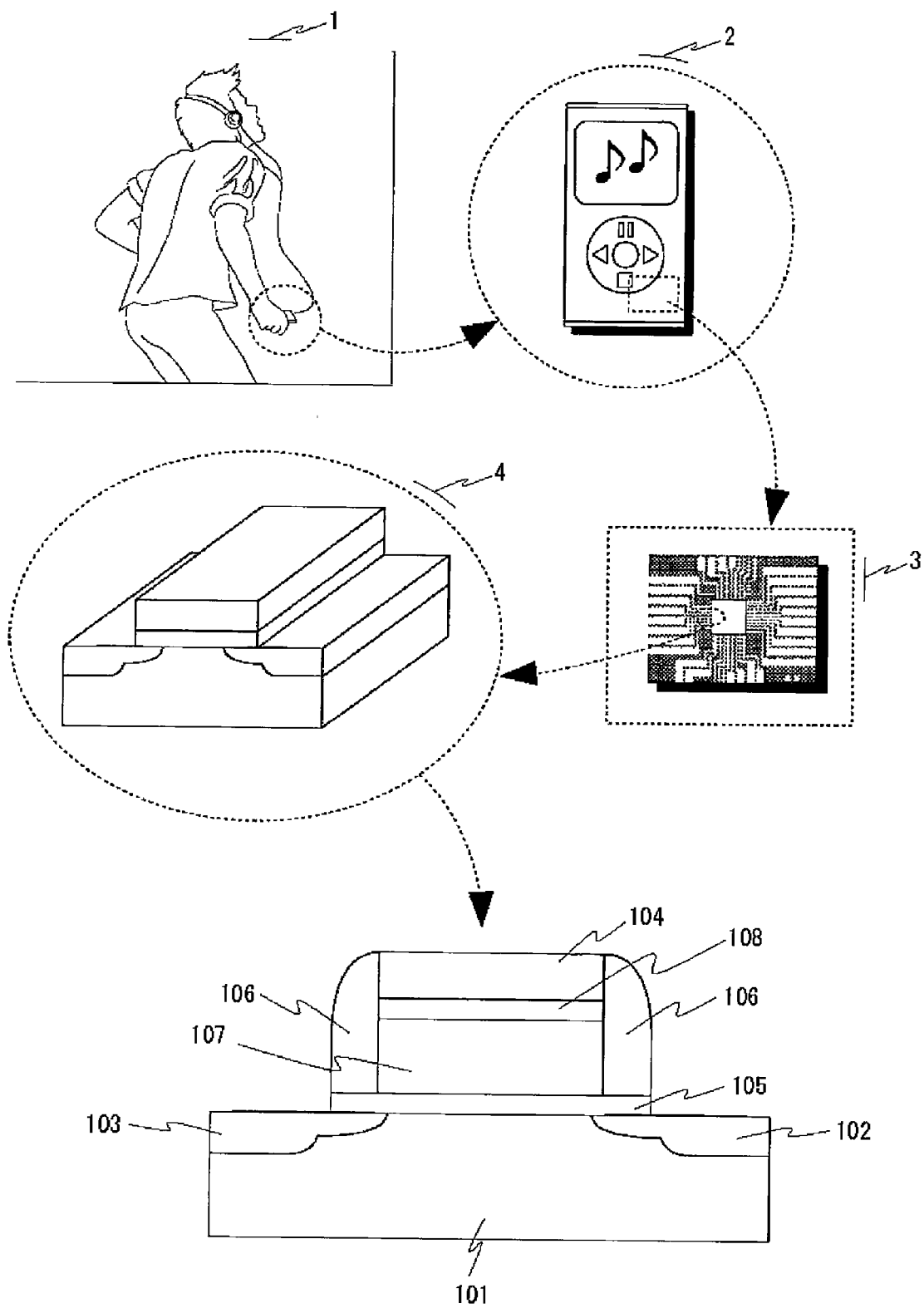
FIG. 1 shows an image of use of a semiconductor memory by a user and the basic configuration of a semiconductor memory.
Figure 2:
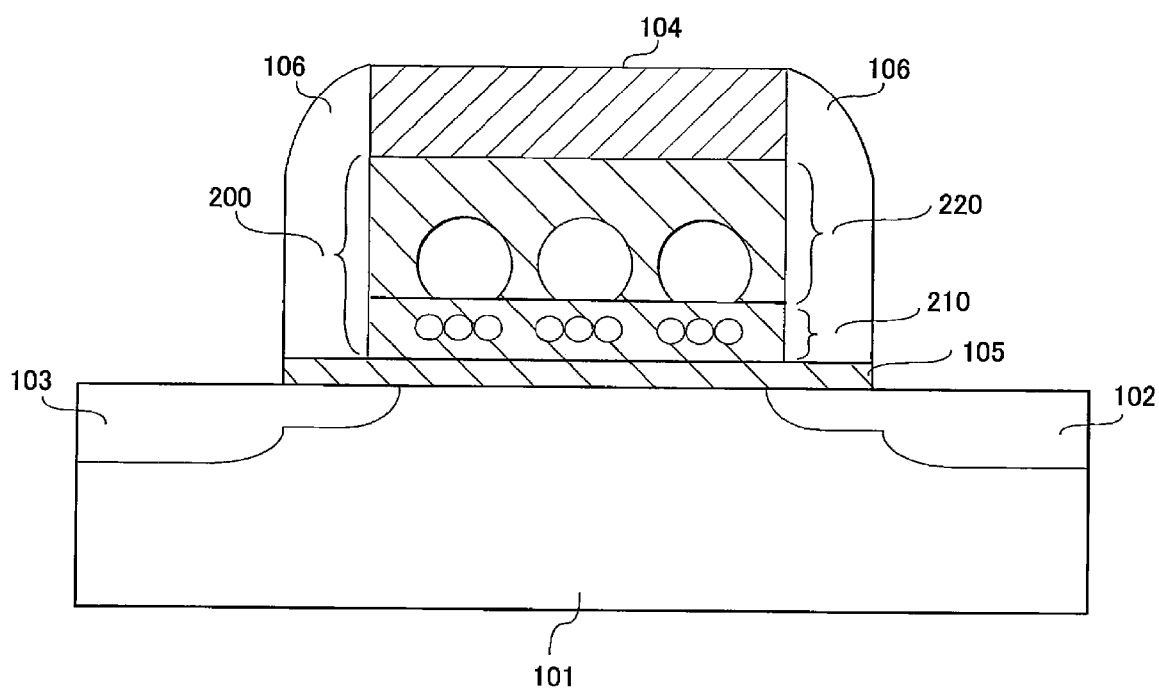
FIG. 2 is a section view of a conventional semiconductor memory having a floating gate.

Embodiments of the present invention will be described in detail with reference to the drawings. The same or equivalent components in the drawings are designated with identical reference numerals and are not described again.

First Embodiment

Figure 3:
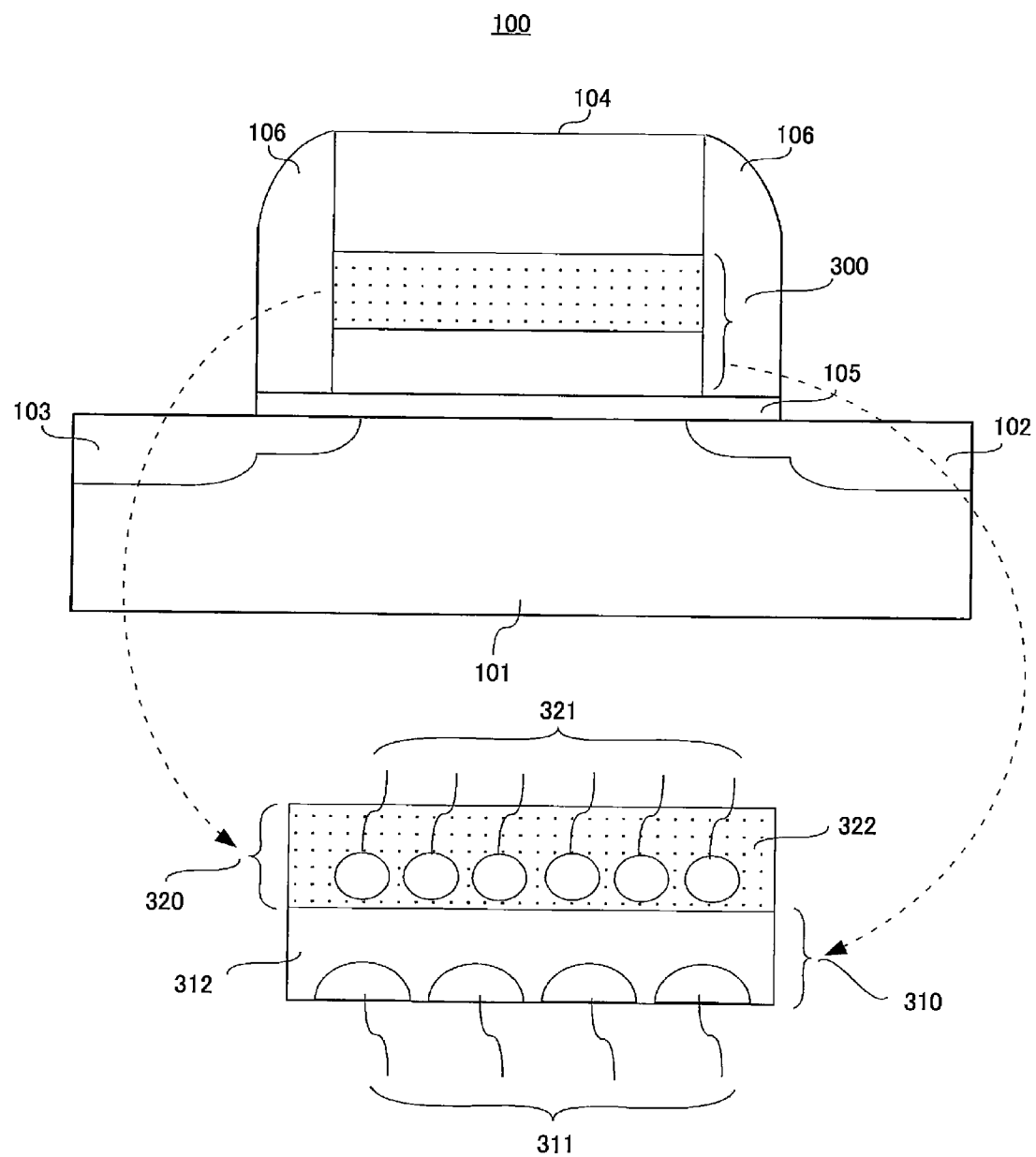
FIG. 3 is a section view of a semiconductor memory according to a first embodiment of the present invention.

FIG. 3 is a section view of a semiconductor memory according to a first embodiment of the present invention. Referring to FIG. 3, a semiconductor memory 100 according to the first embodiment of the present invention includes a semiconductor substrate 101, a source electrode 102, a drain electrode 103, an insulation film 105, a composite floating gate 300, a gate electrode 104, and side walls 106.

The semiconductor memory 100 according to the present invention has a configuration where the composite floating gate 300 is provided between the insulation film 105 and the gate electrode 104. The composite floating gate 300 is constituted by a laminate of a control node 310 and a charge accumulation node 320. The control node 310 is constituted by quantum dots 311 and a Si oxide film 312 covering the quantum dots 311. The charge accumulation node 320 is constituted by silicide quantum dots 321 and a high dielectric insulation film 322 covering the silicide quantum dots 321. The performance of the semiconductor memory 100 varies in accordance with a combination of materials of the nodes and a combination of nodes laminated.

"Quantum dots" are quantum structures composed of a conductive material. Quantum dots are spherical or hemispherical micro crystals constituted by semiconductor single crystals having a size small enough to cause an increase in electrostatic energy by 1 to the dots to be larger than 26 meV, which is the energy of the dots at room temperature. When Si is used as the material of quantum dots, the quantum dots typically have a size of 10 nm or less. A "film" is used to cover the quantum dots and a material of such a film can be selected from various materials.

Hereinafter, specific descriptions are made. The semiconductor substrate 101 is constituted by an n-type single crystal silicon (Si) substrate having a plane 103 direction. The source electrode 102 and the drain electrode are formed on a main surface side of the semiconductor substrate 101. The source electrode 102 and the drain electrode 103 are formed of $p^+$-type Si.

The insulation film 105 is composed of $SiO_2$ and formed to be in contact with a main surface of the semiconductor substrate 101. The insulation film 105 has a thickness of about 2 to 4 nm. Electrons can tunnel through the insulation film 105 having such a thickness of 2 to 4 nm.

The composite floating gate 300 is formed to be in contact with the insulation film 105. The gate electrode 104 is formed to be in contact with the composite floating gate 300. The gate electrode 104 is composed of an impurity semiconductor or a translucent conductive material. Specifically, the gate electrode 104 is composed of a pure metal such as tantalum (Ta), aluminum (Al), tungsten (W), or molybdenum (Mo), alloys of such the pure metal, a transparent conductive material such as ITO (indium tin oxide) or IZO (indium zinc oxide), a semiconductor whose resistance is reduced by being doped with an impurity in a high concentration, or the like.

The side walls 106 are composed of insulation films including silicon oxide films. The side walls 106 are formed on the insulation film 105 to sandwich the composite floating gate 300 and the gate electrode 104 in the lateral direction.

The composite floating gate 300 is constituted by the control node 310 and the charge accumulation node 320. The control node 310 is formed to be in contact with the insulation film 105. The charge accumulation node 320 is formed to be in contact with the control node 310. Thus, the composite floating gate 300 has a bilayer configuration where the charge accumulation node 320 is laminated on the control node 310.

The control node 310 is constituted by the plurality of quantum dots 311 and the Si oxide film 312. The plurality of quantum dots 311 are formed on the insulation film 105 in two dimensions. Each of the plurality of quantum dots 311 is composed of generally hemispherical Si crystals and has a diameter of 10 nm or less and a height of 7 nm. The Si oxide film 312 is formed to cover the plurality of quantum dots 311.

The charge accumulation node 320 is constituted by the plurality of silicide quantum dots 321 and the high dielectric insulation film 322. The plurality of silicide quantum dots 321 are formed on the Si oxide film 312 of the control node 310 in two dimensions. Each of the plurality of silicide quantum dots 321 is composed of generally spherical nickel silicide (Ni silicide) or tungsten silicide (W silicide) and has an average height of about 6 nm.

The high dielectric insulation film 322 is formed to cover the plurality of silicide quantum dots 321. The high dielectric insulation film 322 is composed of a tantalum oxide film (Ta oxide film) or a zirconium oxide film (Zr oxide film).

A Ta oxide film or a Zr oxide film is used as the high dielectric insulation film 322 by the following reason. Use of a Ta oxide film or a Zr oxide film permits excitation of electrons with infrared light commonly used for data communications and injection of the electrons into quantum dots. As a result, data can be output from an integrated circuit produced with the semiconductor memory 100 according to the present invention through a high speed communication network.

When a positive voltage is applied to the gate electrode 104, electrons in the semiconductor substrate 101 tunnel through the insulation film 105 to the quantum dots 311 or electrons in the quantum dots 311 tunnel through the insulation film 105 to the semiconductor substrate 101.

The control node 310 has a function of controlling injection of electrons from the semiconductor substrate 101 into the charge accumulation node 320 and emission of electrons from the charge accumulation node 320 to the semiconductor substrate 101. The charge accumulation node 320 has a function of retaining electrons injected from the semiconductor substrate 101 through the control node 310.

A method for producing the semiconductor memory 100 will be described. The source electrode 102 and the drain electrode 103 are formed by doping a main surface of the semiconductor substrate 101 composed of n-type Si with B in high concentration.

After that, the main surface of the semiconductor substrate 101 is oxidized at about 1000° C. in a 2% oxygen atmosphere to form a $SiO_2$ film over the entire main surface of the semiconductor substrate 101. The thus-formed $SiO_2$ film is patterned by photolithography to form the insulation film 105.

The surface of the insulation film 105 is then washed with 0.1% hydrofluoric acid. As a result, the surface of the insulation film 105 is terminated with OH. After that, the quantum dots 311 are formed on the insulation film 105 in a self-organizing manner by low pressure chemical vapour deposition (LPCVD) with silane ($SiH_4$) gas as a material.

The quantum dots 311 are then oxidized in an oxygen atmosphere to form the Si oxide film 312 having a thickness of about 2 nm. After that, quantum dots composed of Si crystals are formed on the Si oxide film 312 by the above-described method and a Ni thin film is further formed on the thus-formed quantum dots. These quantum dots and the Ni thin film are heated to form the silicide quantum dots 321.

The high dielectric insulation film 322 is subsequently formed on the silicide quantum dots 321 and the gate electrode 104 is formed on the high dielectric insulation film 322.

After that, the quantum dots 311, the Si oxide film 312, the silicide quantum dots 321, the high dielectric insulation film 322, and the gate electrode 104 are patterned to have certain sizes by photolithography. The side walls 106 are formed to sandwich, in the lateral direction, the quantum dots 311, the Si oxide film 312, the silicide quantum dots 321, the high dielectric insulation film 322, and the gate electrode 104. Thus, the semiconductor memory 100 is completed.

The insulation film 105 has been conventionally formed of a hafnium oxide ($HfO_2$) film (J. J. Lee et al., 2003 Symposium on VLSI Technology Digest of Technical Papers (2003) p. 33). In this case, there are defects at the interface between the insulation film 105 and the semiconductor substrate 101. Such defects cause interface levels having high density and the levels capture carriers when a device is activated. This results in an increase in threshold voltage and a decrease in field effect mobility.

In contrast, in the semiconductor memory 100 according to the present invention, the interface between the insulation film 105 and the semiconductor substrate 101 is constituted by $SiO_2$ and Si as described above. For this reason, the interface is extremely clean and the interface levels are low. Therefore, the semiconductor memory 100 according to the present invention does not cause a problem of an increase in threshold voltage or a decrease in field effect mobility.

Second Embodiment

Figure 4:
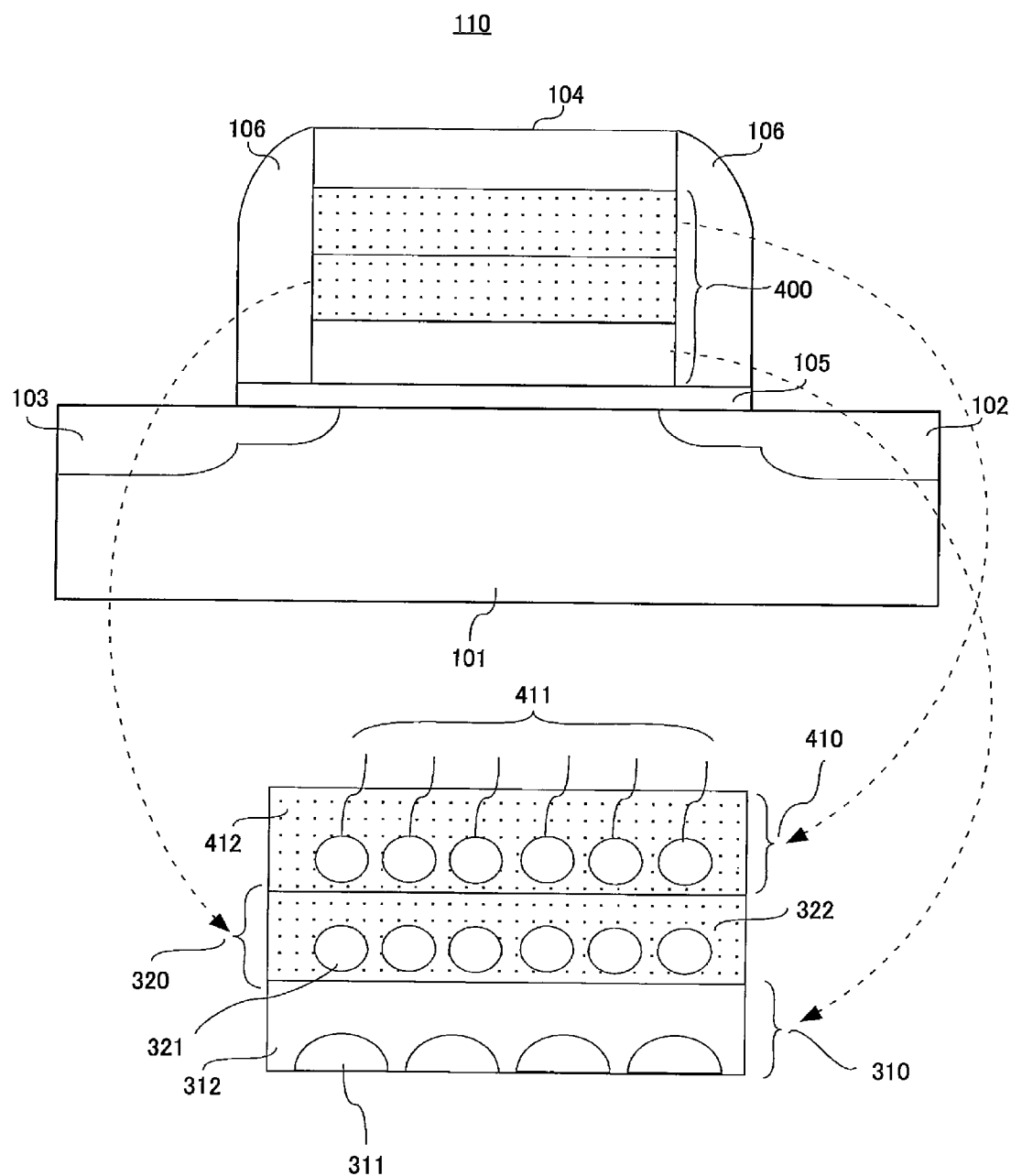
FIG. 4 is a section view of a semiconductor memory according to a second embodiment.

FIG. 4 is a section view of a semiconductor memory according to a second embodiment. Referring to FIG. 4, a semiconductor memory 110 according to the second embodiment is the same as the semiconductor memory 100 shown in FIG. 3 except that the composite floating gate 300 of the semiconductor memory 100 is replaced by a composite floating gate 400.

The composite floating gate 400 is the same as the composite floating gate 300 shown in FIG. 3 except that the composite floating gate 400 further includes a control node 410.

The control node 410 is formed on the charge accumulation node 320. Thus, the composite floating gate 400 has a trilayer configuration where the control node 410 is laminated on the composite floating gate 300 having the above-described bilayer configuration. The composite floating gate 400 is provided between the insulation film 105 and the gate electrode 104.

The control node 410 has a function of controlling emission of electrons in erasing memory of the semiconductor memory 110. The control node 410 is constituted by a plurality of quantum dots 411 and a high dielectric insulation film 412. The plurality of quantum dots 411 are formed on the high dielectric insulation film 322 of the charge accumulation node 320 in two dimensions. Each of the plurality of quantum dots 411 is composed of generally spherical Si crystals and has an average height of 6 nm (10 nm or less is sufficient.). The high dielectric insulation film 412 is formed to cover the plurality of quantum dots 411. The high dielectric insulation film 412 is composed of a Ta oxide film or a Zr oxide film.

The reason why the high dielectric insulation film 412 is composed of a Ta oxide film or a Zr oxide film is the same as the above-described reason why the high dielectric insulation film 322 is composed of a Ta oxide film or a Zr oxide film.

A method for producing the semiconductor memory 110 will be described. The semiconductor memory 110 is produced by a method where a step of forming the quantum dots 411 by the same method for forming the quantum dots 311 and forming the high dielectric insulation film 412 on the thus-formed quantum dots 411 by the same method for forming the high dielectric insulation film 322 is inserted between the formation of the charge accumulation node 320 and the formation of the gate electrode 104 in the above-described method for producing the semiconductor memory 100.

Other than that, the semiconductor memory 110 is the same as the semiconductor memory 100.

In FIGS. 3 and 4 described above, the nodes are delimited by substantially horizontal planes for simplicity. However, the quantum dots are actually provided on the films in two dimensions. For this reason, the boundary between the insulation film 105 and the control node 310 is close to a substantially horizontal plane, whereas the boundary between the control node 310 and the charge accumulation node 320 and the boundary between the charge accumulation node 320 and the control node 410 have irregularities according to the shape of the quantum dots.

As described below, the semiconductor memory 100, 110 according to the present invention conducts a writing operation by injecting electrons from the semiconductor substrate 101 into the Si-based quantum dots 311 or the silicide quantum dots 321 and conducts erasure by emitting the electrons to the semiconductor substrate 101. Thus, the emission of electrons is not influenced even when the high dielectric insulation film 322 has a large thickness. Therefore, the problem of low erasing speed occurring in the conventional example of J. J. Lee et al., 2003 Symposium on VLSI Technology Digest of Technical Papers (2003) p. 33 does not occur.

[Operations of Semiconductor Memory]

A memory writing operation and a memory erasing operation in the semiconductor memory 100, 110 according to the first and second embodiments will be described.

FIGS. 5 to 10 are the first to sixth energy band diagrams for describing a memory writing operation and a memory erasing operation in the semiconductor memory 100, 110.

Hereinafter, the memory writing operation and the memory erasing operation are described with reference to energy band diagrams of a transistor capacitor portion in the second embodiment.

Figure 5:
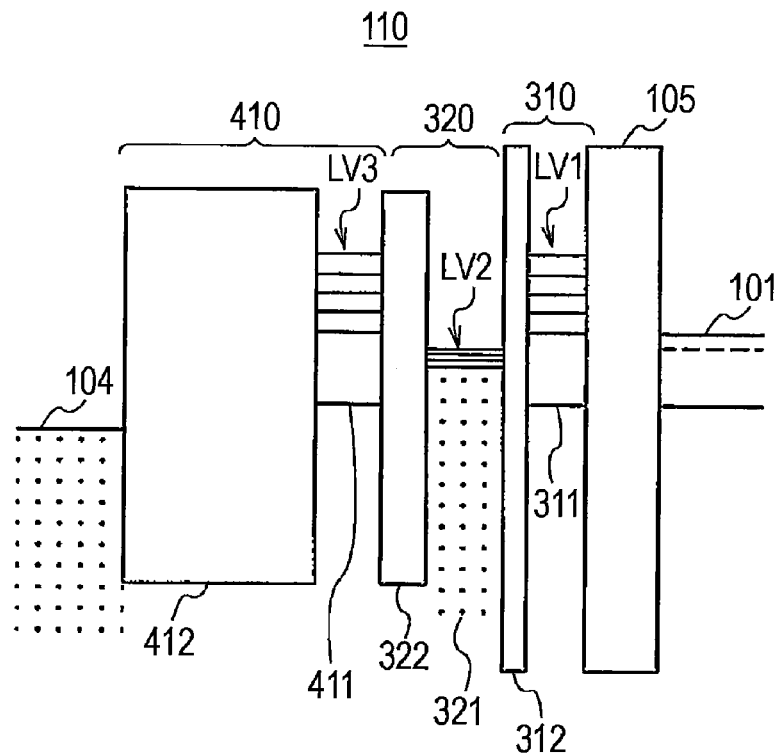
FIG. 5 is a first energy band diagram for describing a memory writing operation and a memory erasing operation in a semiconductor memory.

Referring first to FIG. 5, an energy band diagram where a positive voltage is not applied to the gate electrode 104 of the semiconductor memory 110 will be described. Since the quantum dots 311 of the control node 310 are sandwiched between the insulation film 105 and the Si oxide film 312 and have a size of nanometer order, discrete energy levels LV1 exist in the conduction band of the quantum dots 311. Likewise, discrete energy levels LV2 exist in the conduction band of the silicide quantum dots 321 and discrete energy levels LV3 exist in the conduction band of the quantum dots 411. These energy levels LV1 to LV3 are energy levels for electrons.

Since the quantum dots 311 are composed of Si crystals that constitute the quantum dots 411, the energy levels LV1 are the same as the energy levels LV3. The silicide quantum dots 321 are composed of a material different from the material of the quantum dots 311 and 411, and therefore the energy levels LV2 are lower than the energy levels LV1 and LV3. The silicide quantum dots 321 are composed of a material different from the material of the semiconductor substrate 101, and therefore the energy levels LV2 are lower than the conduction band of the semiconductor substrate 101.

As described above, in the semiconductor memory 110, the energy levels LV2 for electrons in the quantum dots 321 of the charge accumulation node 320 are lower than the energy levels LV1 and LV3 for electrons in the quantum dots 311 and 411 of the control nodes 310 and 410, which are provided on both sides of the charge accumulation node 320. Thus, the charge accumulation node 320 is composed of a material different from the material of the control nodes 310 and 410 such that the energy levels LV2 for electrons in the quantum dots 321 are lower than the energy levels LV1 and LV3 for electrons in the quantum dots 311 and 411.

Figure 6:
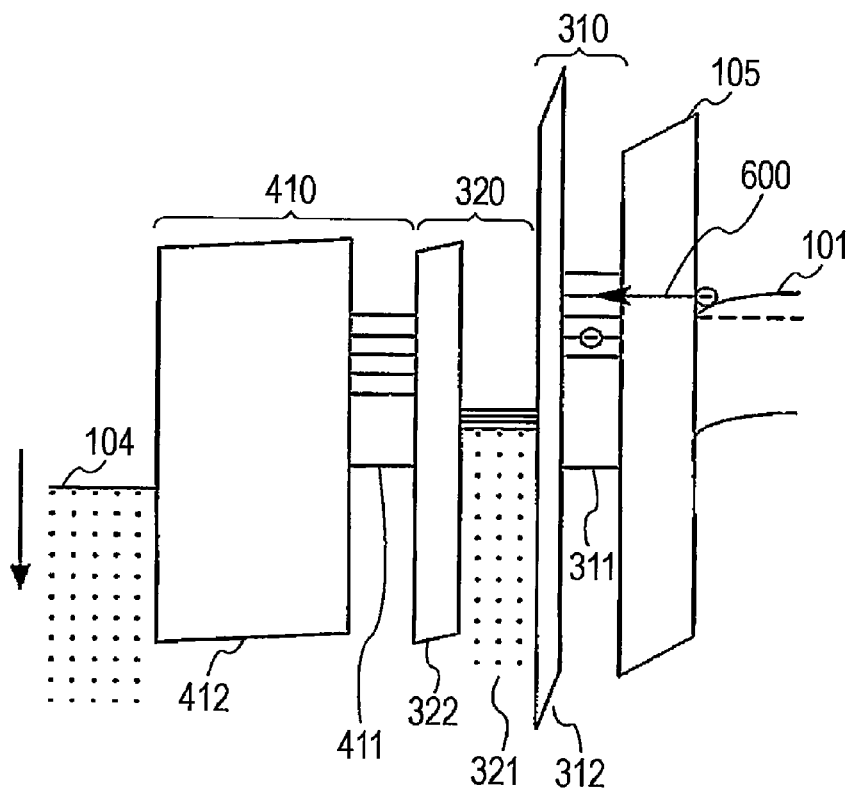
FIG. 6 is a second energy band diagram for describing a memory writing operation and a memory erasing operation in a semiconductor memory.

Referring then to FIG. 6, the memory writing operation in the semiconductor memory 110 having the energy band diagram shown in FIG. 5 is conducted by applying a positive voltage to the gate electrode 104 to inject electrons from the semiconductor substrate 101 into the Si-based quantum dots 311 or the silicide quantum dots 321.

When a positive voltage is applied to the gate electrode 104, an electron 600 in the semiconductor substrate 101 tunnels through the insulation film 105 and is injected into the Si-based quantum dots 311 of the control node 310. Such an injection of an electron to the Si-based quantum dots 311 increases the electrostatic energy of the Si-based quantum dots 311. Thus, retention of an electron in the Si-based quantum dots 311 causes the band of the semiconductor substrate 101 to bend downward. This state is determined as a logical "1".

When a higher positive voltage is applied to the gate electrode 104, another electron in the semiconductor substrate 101 tunnels through the insulation film 105 and is injected into the Si-based quantum dots 311 of the control node 310. Thus, a second electron 700 is injected into the Si-based quantum dots 311 (see FIG. 7). This state is determined as a logical "2".

In this way, by applying a positive voltage to the gate electrode 104, the electrons 600 in the semiconductor substrate 101 one by one tunnel through the insulation film 105 and are injected into the Si-based quantum dots 311 of the control node 310. With such a state, multivalued expression can be achieved.

Electrons injected into the Si-based quantum dots 311 are retained in the quantum dots 311 until light is input or an electron emission operation is conducted.

When a further higher positive voltage is applied to the gate electrode 104 of the semiconductor memory 110, an electron 801 in the semiconductor substrate 101 is injected into the Si-based quantum dots 311 in the same manner described above (see FIG. 8). When the amount of electrons accumulated in the Si-based quantum dots 311 exceeds a certain level, an electron 802 retained in the Si-based quantum dots 311 tunnels through the Si oxide film 312 and is injected into the silicide quantum dots 321 (see FIG. 8).

Since the silicide quantum dots 321 have a nano (quantum) structure, discrete energy levels LV2 exist. These energy levels LV2 are lower than the energy levels LV1 and LV3 of the quantum dots 311 and 411 in the control nodes 310 and 410. As a result, a shift of threshold caused by electron retention can be detected in the silicide quantum dots 321. Furthermore, since a metal material is used for the silicide quantum dots 321, there is no limit for the number of electrons to be retained and a large number of electrons can be retained stably. For this reason, time for which electrons are retained is increased and, as a result, time for which information is retained is extended. Additionally, by using the silicide quantum dots 321 as a charge retention node, the thickness of the insulation film 105 can be extremely reduced, the insulation film 105 considerably influencing time required for injecting electrons, that is, time for which information is written. Thus, writing speed can also be improved efficiently.

In contrast, in the techniques disclosed in Japanese Unexamined Patent Application Publication No. 09-260611 and J. J. Lee et al., 2003 Symposium on VLSI Technology Digest of Technical Papers (2003) p. 33, the material of the charge retention node is the same as the material of the semiconductor substrate 101 to which electrons are emitted. For this reason, it is difficult to reduce the thickness of the insulation film 105 for the purpose of improving the retention time and the insulation film 105 must have a relatively large thickness. Therefore, it is difficult to simultaneously achieve reduction in writing time.

In the above-described semiconductor memory 110 according to the present invention, electrons can be efficiently injected at a high speed into the Si-based quantum dots 311 or the silicide quantum dots 321 by providing an electric pulse or an optical pulse from an impurity semiconductor or a translucent metal constituting the gate electrode 104.

The semiconductor memory 110 according to the present invention has an interface between $SiO_2$ and Si or silicide at the boundary surface between the insulation film 105 and the semiconductor substrate 101. As a result, an increase in threshold voltage or a decrease in field effect mobility is not caused and good transistor characteristics can be achieved.

Next, a memory erasing operation in the semiconductor memory 110 according to the present invention is described. Such memory erasure in the semiconductor memory 110 according to the present invention is conducted by applying light or a negative voltage to the gate electrode 104 to emit electrons that have been injected into the Si-based quantum dots 311 or the silicide quantum dots 321 to the semiconductor substrate 101.

Hereinafter, an erasing operation in the semiconductor memory 110 is described with reference to FIGS. 9 and 10. The present invention embraces the configuration of the semiconductor memory 100 according to the first embodiment and the configuration of the semiconductor memory 110 according to the second embodiment. Since these configurations operate similarly in some steps, the following description is based on the configuration of a transistor capacitor portion in the configuration of the semiconductor memory 110 according to the second embodiment.

When written information is to be erased, a weak light 900 is incident on the gate electrode 104. When the weak light 900 enters the gate electrode 104, an internal photoelectric effect causes excitation of electrons retained in the silicide quantum dots 321 of the charge accumulation node 320. As a result, in the semiconductor memory 100 according to the first embodiment, an electron 901 retained in the silicide quantum dots 321 is emitted to the Si-based quantum dots 311 of the control node 310 (see FIG. 9).

Figure 9:
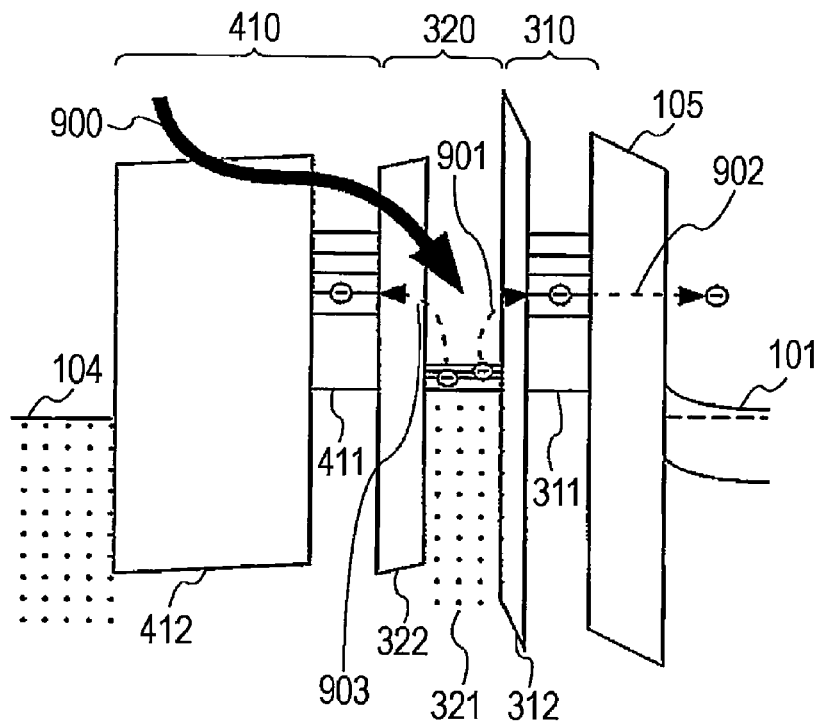
FIG. 9 is a fifth energy band diagram for describing a memory writing operation and a memory erasing operation in a semiconductor memory.
Figure 10:
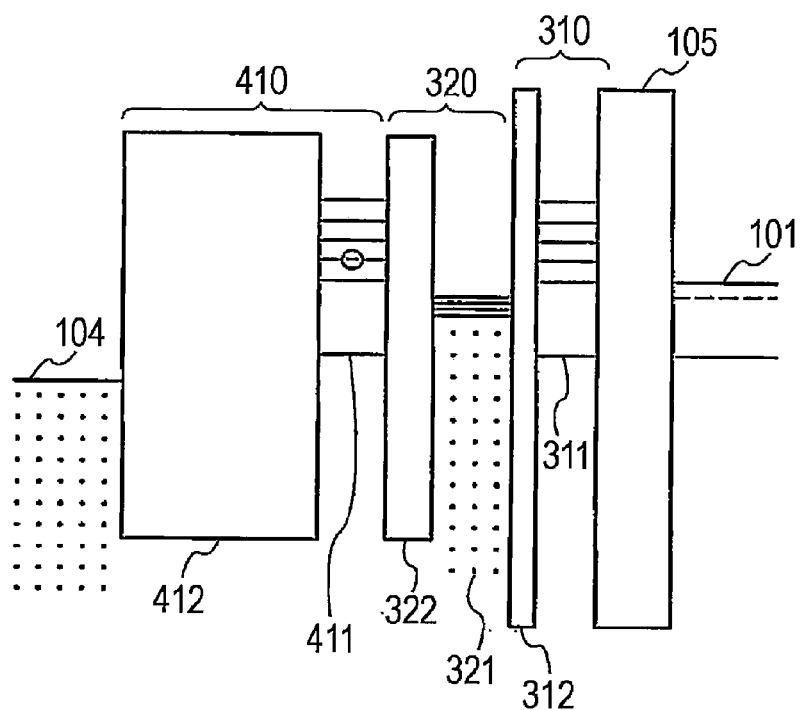
FIG. 10 is a sixth energy band diagram for describing a memory writing operation and a memory erasing operation in a semiconductor memory.

By applying a lower negative voltage to the gate electrode 104, an electron 902 in the Si-based quantum dots 311 is emitted to the semiconductor substrate 101 (see FIG. 9).

In the semiconductor memory 110 according to the second embodiment, the electron 901 and an electron 903 retained in the silicide quantum dots 321 are respectively emitted to the Si-based quantum dots 311 of the control node 310 and the Si-based quantum dots 411 of the control node 410 (see FIG. 9).

By applying a further lower negative voltage to the gate electrode 104, only the electron 902 in the Si-based quantum dots 311 is emitted to the semiconductor substrate 101 (see FIG. 9).

Specifically, in the semiconductor memory 110 according to the second embodiment, electrons retained in the silicide quantum dots 321 of the charge accumulation node 320 are separately emitted to the Si-based quantum dots 311 of the control node 310 and the Si-based quantum dots 411 of the control node 410. In this way, the semiconductor memory 110 does not emit all the retained electrons simultaneously and emits under the control with gate voltage only an electron emitted to the Si-based quantum dots 311 of the control node 310 (see FIG. 10).

As a result, an erasing operation can be partially conducted in a multivalued memory and hence the memory erasing operation can be controlled with more certainty.

To simultaneously emit all the electrons, the weak light 900 is incident on the gate electrode 104 while a negative voltage is applied to the gate electrode 104. As a result, electrons retained in the silicide quantum dots 321 can be simultaneously emitted to the Si-based quantum dots 311 of the control node 310 by the internal photoelectric effect and further application of voltage causes electrons retained in the Si-based quantum dots 311 to be emitted to the semiconductor substrate 101. Thus, since no electron is now retained, the data has been erased.

Since the barrier of the Si-based quantum dots 311 of the control node 310 and the barrier of the Si-based quantum dots 411 of the control node 410 against the silicide quantum dots 321 are low, electrons can be easily emitted with infrared light. Thus, the semiconductor memory 110 according to the present invention has an advantage that data can be output with infrared light, which is commonly used for optical data communications.

A light source for the weak light 900 may be provided by applying an organic EL material to the inside of the memory package.

In the conventional configuration disclosed in J. J. Lee et al., 2003 Symposium on VLSI Technology Digest of Technical Papers (2003) p. 33 where high dielectric insulation films vertically sandwich quantum dots, the gate voltage is applied similarly to both of the high dielectric insulation films and voltage drop in the high dielectric insulation film on the gate-insulation-film-side cannot be ignored. For this reason, to generate a sufficient electric field at the insulation film 105 (tunnel oxide film), which is important for electron emission, a high gate voltage must be applied.

In contrast, in the semiconductor memory 100, 110 according to the present invention, the high dielectric insulation film (322, 412) is used as the gate insulation film 322 and Si-based oxide films are used for the Si oxide film 312 and the insulation film 105 (tunnel oxide film). For this reason, when a negative voltage is applied for electron emission, a weak electric field is applied to the high dielectric insulation film and a strong electric field is applied to the insulation film 105 serving as a tunnel oxide film. As a result, electrons injected into the silicide quantum dots 321 can be effectively emitted in a short time and at a relatively low gate voltage to the semiconductor substrate 101. Since electron transfer in the composite floating gate (300, 400) is used, a problem of a decrease in erasing speed occurring in the case of using a $HfO_2$ film in J. J. Lee et al., 2003 Symposium on VLSI Technology Digest of Technical Papers (2003) p. 33 does not occur. Thus, high speed optical responses can be expected. Therefore, high speed memory erasure can be achieved.

By using the composite floating gate (300, 400), the electron injection means, and the electron emission means that are described above, multivalued storing operations can be achieved in the semiconductor memory 100, 110 according to the present invention.

By injecting electrons into silicide quantum dots with which a deeper potential well can be achieved for electron system than Si-based quantum dots, the injected electrons can be stably accumulated in the silicide quantum dots and the occurrence of electron emission is reduced. As a result, the writing and erasing time can be reduced by reducing the thickness of the insulation film 105 and hence multivalued storing operations can be conducted with stability and at a high speed.

[Method for Producing Metal Quantum Dots]

Figure 11:
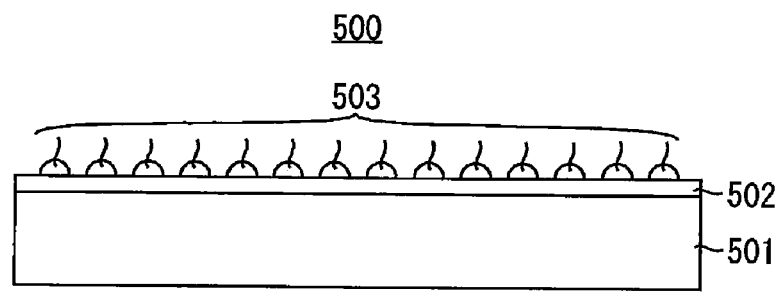
FIG. 11 is a section view of metal quantum dots.

FIG. 11 is a section view showing metal quantum dots. Referring to FIG. 11, metal quantum dots 500 include a semiconductor substrate 501, a $SiO_2$ film 502, and a plurality of metal dots 503. The semiconductor substrate 501 is composed of Si having the (100) plane. The $SiO_2$ film 502 is formed on a main surface of the semiconductor substrate 501.

The plurality of metal dots 503 are formed on the $SiO_2$ film 502. Each of the plurality of metal dots 503 is composed of Ni, has a diameter of about 30 nm, and has a height in the range of 0.9 to 6 nm.

Figure 12:
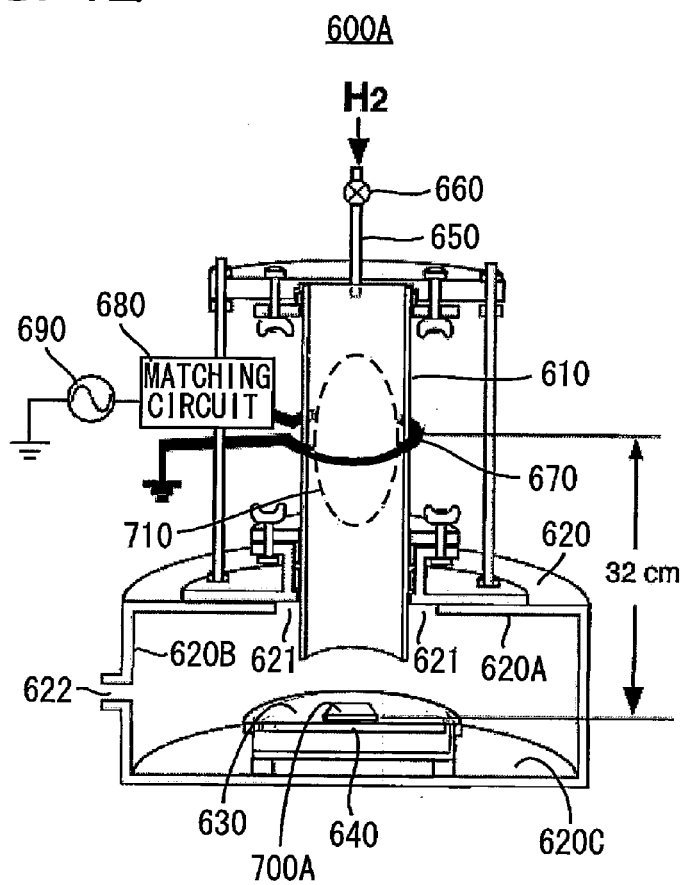
FIG. 12 is a schematic view showing a plasma treatment apparatus for conducting a remote hydrogen plasma treatment.

FIG. 12 shows a schematic view showing a plasma treatment apparatus for conducting a remote hydrogen plasma treatment. Referring to FIG. 12, a plasma treatment apparatus 600A includes a quartz tube 610, a reaction chamber 620, a substrate holder 630, a heater 640, a tube 650, a valve 660, an antenna 670, a matching circuit 680, and a high-frequency power source 690.

The quartz tube 610 has a diameter of 10 cm and is fixed such that one end of the quartz tube 610 is inserted into the reaction chamber 620. The reaction chamber 620 has the shape of a hollow cylinder and includes an opening 621 for receiving the one end of the quartz tube 610 through an upper surface 620A and an exhaust hole 622 in a side surface 620B. By inserting the one end of the quartz tube 610 through the opening 621, the internal space of the reaction chamber 620 is in communication with the internal space of the quartz tube 610. Therefore, gas in the reaction chamber 620 and the quartz tube 610 can be exhausted via the exhaust hole 622 with a pump (not shown).

The substrate holder 630 is disposed on a bottom surface 620C of the reaction chamber 620. The heater 640 is composed of silicon carbide (SiC) and disposed in the substrate holder 630.

The tube 650 is connected to the other end of the quartz tube 610 via the valve 660. The valve 660 is attached to the tube 650. The antenna 670 is disposed to surround the quartz tube 610, at a position away from a substrate 700A disposed on the substrate holder 630 by 32 cm. One end of the antenna 670 is connected to the matching circuit 680 and the other end of the antenna 670 is grounded.

The matching circuit 680 is connected between the one end of the antenna 670 and the high-frequency power source 690. The high-frequency power source 690 is connected between the matching circuit 680 and a grounding node.

The heater 640 heats the substrate 700A to a certain temperature via the substrate holder 630. The tube 650 introduces hydrogen ($H_2$) gas from a gas cylinder (not shown) into the quartz tube 610. The valve 660 provides $H_2$ gas into the quartz tube 610 or blocks entry of $H_2$ gas into the quartz tube 610.

The matching circuit 680 reduces reflection of high-frequency power provided by the high-frequency power source 690 toward the high-frequency power source 690 side to provide the high-frequency power to the antenna 670. The high-frequency power source 690 provides high-frequency power at 60 MHz to the antenna 670 via the matching circuit 680.

Treatment operations in the plasma treatment apparatus 600A will be described. The substrate 700A is disposed on the substrate holder 630 and air is evacuated from the reaction chamber 620 and the quartz tube 610 via the exhaust hole 622.

After that, the valve 660 is opened and $H_2$ gas in a certain amount is introduced from a gas cylinder (not shown) into the quartz tube 610 via the tube 650. When the internal pressure of the quartz tube 610 increases to a certain value, the high-frequency power source 690 provides high-frequency power at 60 MHz to the antenna 670 via the matching circuit 680. In this case, the matching circuit 680 is adjusted to minimize reflection of high-frequency power provided by the high-frequency power source 690 toward the high-frequency power source 690 side.

As a result, a plasma 710 is generated in the quartz tube 610. Mainly atomic hydrogen diffuses from the generation region of the plasma 710 toward the substrate 700A through the quartz tube 610 and reaches the surface of the substrate 700A. Thus, the surface of the substrate 700A is treated with the atomic hydrogen.

After a lapse of certain treatment time, the high-frequency power source 690 is turned off and the valve 660 is closed. Thus, the treatment operations are complete.

FIG. 13 is a process chart showing a method for producing the metal quantum dots 500 shown in FIG. 11. Referring to FIG. 13, when a series of operations is initiated, the semiconductor substrate 501 composed of Si having the (100) plane is cleaned by RCA cleaning (see FIG. 13 (a)).

After that, the semiconductor substrate 501 is placed in an oxidizing apparatus and subjected to thermal oxidation with a 2% oxygen ($O_2$) gas at a temperature of 1000° C. As a result, the $SiO_2$ film 502 is formed on a surface of the semiconductor substrate 501 (see FIG. 13 (b)).

A Ni thin film 504 is then deposited on the $SiO_2$ film 502 by an electron-beam evaporation method at a pressure of $2.66 \times 10^{-4}$ Pa (see FIG. 13 (c)). In this case, the Ni thin film 504 has a thickness of 1.8 nm.

After that, the resulting sample of Ni thin film 504/$SiO_2$ film 502/semiconductor substrate 501 is placed above the substrate holder 630 of the plasma treatment apparatus 600A. In this case, the semiconductor substrate 501 is not connected to ground potential and is placed above the substrate holder 630 such that the semiconductor substrate 501 is electrically floated. The Ni thin film 504 of the sample is subjected to a remote hydrogen plasma treatment with the plasma treatment apparatus 600A by the above-described method (see FIG. 13 (d)). In this case, the remote hydrogen plasma treatment is conducted under the conditions shown in Table 1.

TABLE 1

| Frequency | 60 MHz |
| --- | --- |
| Type of antenna | Single-turn antenna |
| Distance between antenna and substrate | 32 cm |
| Substrate temperature | Room temperature |
| VHF power | 200 to 500 W |
| Gas pressure | 1.33 to 79.8 Pa |
| Treatment time | 5 minutes |

As shown in Table 1, the sample of Ni thin film 504/$SiO_2$ film 502/semiconductor substrate 501 is subjected to the remote hydrogen plasma treatment at room temperature.

When the remote hydrogen plasma treatment for 5 minutes is complete, the plurality of metal dots 503 are formed on the $SiO_2$ film 502 (see FIG. 13 (e)). Thus, the operations for producing the metal quantum dots 500 are complete.

In this way, according to the present invention, the metal dots 503 are formed by subjecting the Ni thin film 504 having an extremely small thickness of 1.8 nm to the remote hydrogen plasma treatment at room temperature. Thus, according to the present invention, the metal quantum dots 500 can be produced by simple processes.

The Ni thin film 504 is treated with remote hydrogen plasma while the semiconductor substrate 501 is electrically floated. That is, the Ni thin film 504 is treated with remote hydrogen plasma while damage caused by various ions generated in the plasma 710 is suppressed. Thus, the metal quantum dots 500 having high uniformity can be produced.

Figure 14:
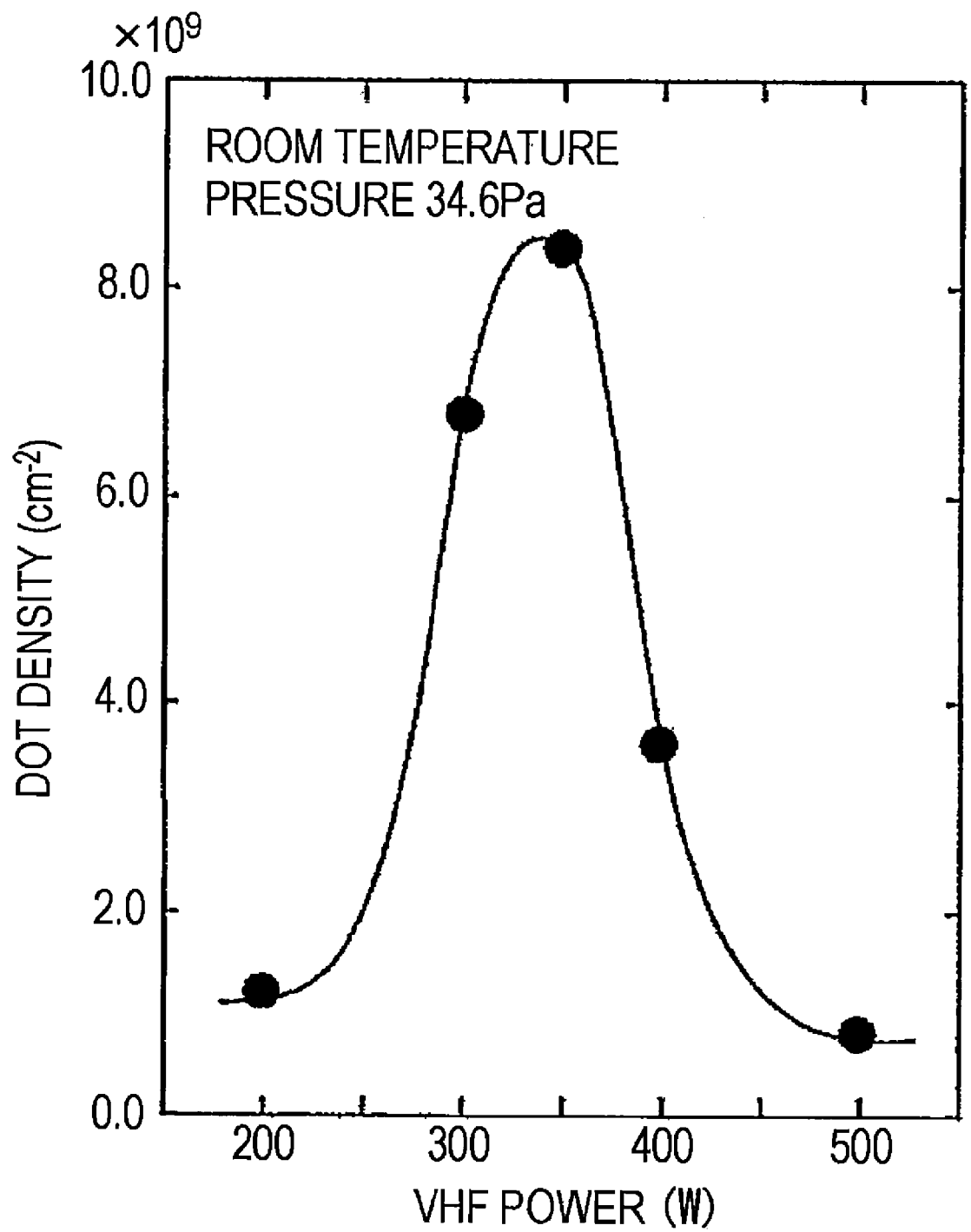
FIG. 14 is a graph showing the relationship between the dot density of metal quantum dots and VHF power.

FIG. 14 is a graph showing the relationship between the dot density of the metal quantum dots 500 and VHF power. In FIG. 14, the ordinate axis indicates the dot density and the abscissa axis indicates the VHF power (high-frequency power). The relationship between the dot density and the VHF power shown in FIG. 14 is based on a remote hydrogen plasma treatment where the substrate temperature is set at room temperature, the gas pressure is set at 34.6 Pa, and the VHF power is changed among 200 W, 300 W, 350 W, 400 W, and 500 W.

Referring to FIG. 14, the dot density increases exponentially with an increase in the VHF power from 200 W to 350 W through 300 W and reaches the maximum value at about 350 W. The dot density then decreases exponentially with an increase in the VHF power beyond 350 W.

In this way, the dot density is highly dependent on the VHF power. Therefore, the dot density of the metal quantum dots 500 can be controlled with the VHF power in the remote hydrogen plasma treatment.

Figure 15:
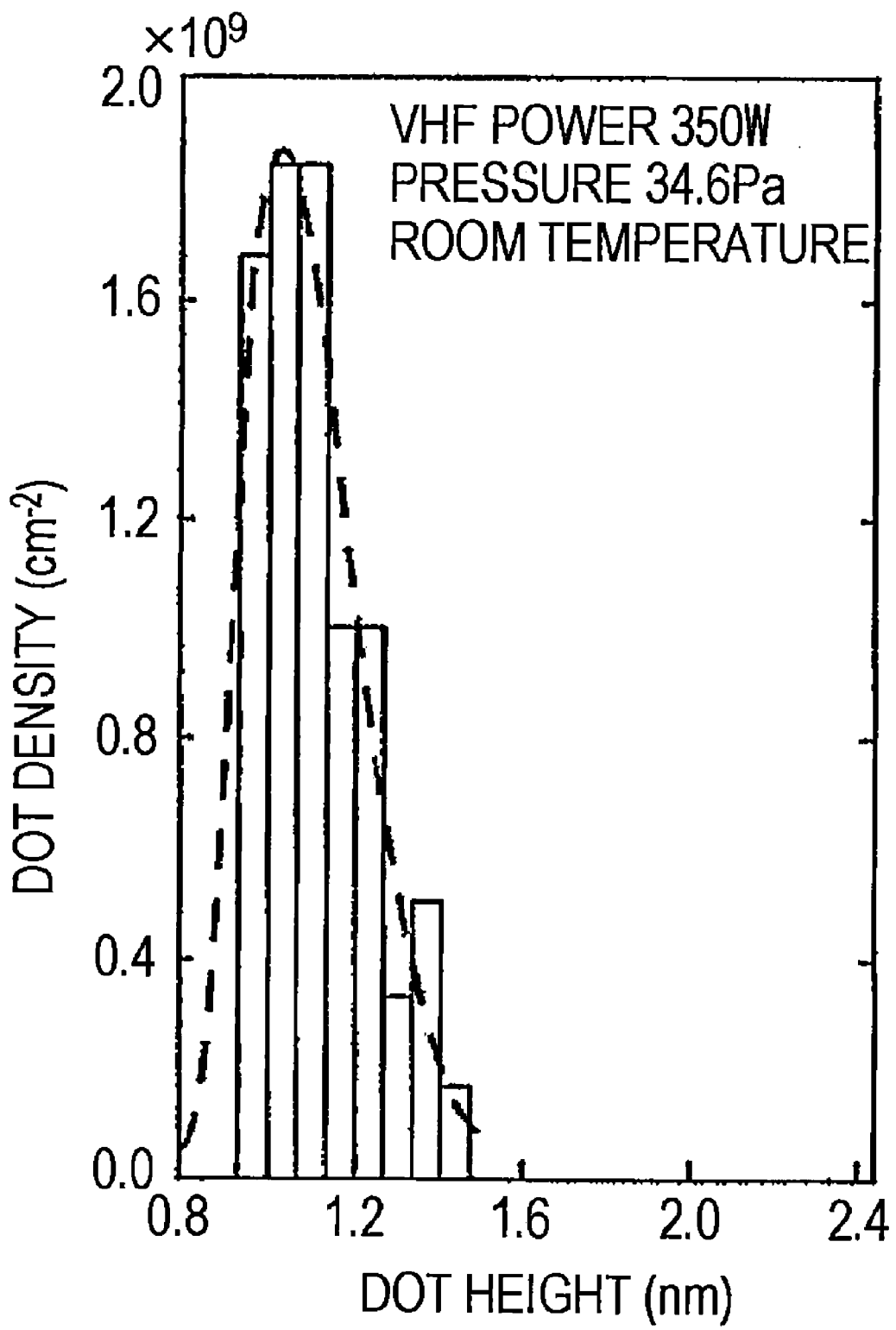
FIG. 15 is a graph showing the relationship between dot density and dot height.

FIG. 15 is a graph showing the relationship between the dot density and the dot height. In FIG. 15, the ordinate axis indicates the dot density and the abscissa axis indicates the dot height. The relationship between the dot density and the dot height shown in FIG. 15 is based on the remote hydrogen plasma treatment where the VHF power is set at 350 W, the pressure is set at 34.6 Pa, and the substrate temperature is set at room temperature.

Referring to FIG. 15, the dot density reaches the maximum value when the dot height is about 1.0 nm. The dot density steeply decreases when the dot height is 1.2 nm or more. The dot height is distributed in the range of about 0.9 nm to about 1.4 nm. By subjecting the Ni thin film 504 to the remote hydrogen plasma treatment, the metal quantum dots 500 having high uniformity can be produced.

Figure 16:
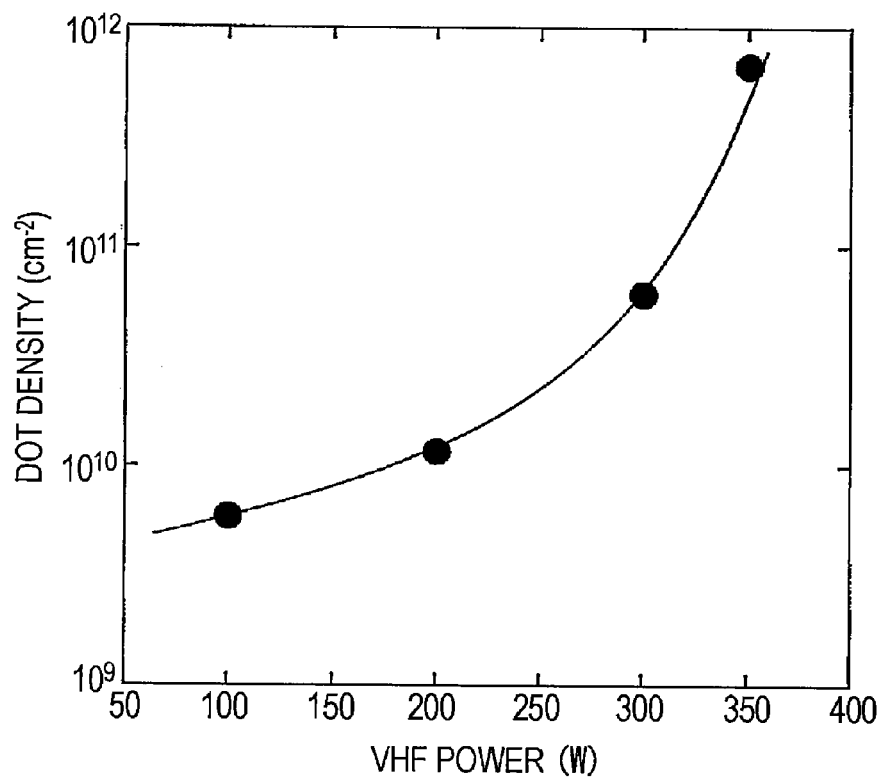
FIG. 16 is a graph showing another relationship between the dot density of metal quantum dots and VHF power.

Formation of the metal dots 503 having higher density in the metal quantum dots 500 will be described. FIG. 16 is a graph showing another relationship between the dot density of the metal quantum dots 500 and VHF power. In FIG. 16, the ordinate axis indicates the dot density and the abscissa axis indicates the VHF power (high-frequency power). The relationship between the dot density and the VHF power shown in FIG. 16 is based on the remote hydrogen plasma treatment where the substrate temperature is set at room temperature, the gas pressure is set at 34.6 Pa, the distance between the antenna 670 and the substrate 700A is set at 23 cm, and the VHF power is changed among 100 W, 200 W, 300 W, and 350 W.

Referring to FIG. 16, when the distance between the antenna 670 and the substrate 700A is set at 23 cm, the dot density increases by about two orders of magnitude with an increase in the VHF power from 100 W to 350 W. A dot density of $6.4 \times 10^{11}$ cm$^{-2}$ was obtained at a VHF power of 350 W.

Compared with the case where the distance between the antenna 670 and the substrate 700A is set at 32 cm (see FIG. 14), the dot density increases by about one order of magnitude at a VHF power of 200 W and 300 W, and the dot density increases by about two orders of magnitude at a VHF power of 350 W.

As described above, as a result of decreasing the distance between the antenna 670 and the substrate 700A from 32 cm to 23 cm, the dot density increases at each value of the VHF power. This is presumably because, as a result of decreasing the distance between the antenna 670 and the substrate 700A from 32 cm to 23 cm, atomic hydrogen generated in the plasma 710 more easily reaches the surface of the substrate 700A.

The metal dots 503 (Ni dots) formed with a distance of 23 cm between the antenna 670 and the substrate 700A have a smaller diameter than the metal dots 503 (Ni dots) formed with a distance of 32 cm between the antenna 670 and the substrate 700A.

Figure 17:
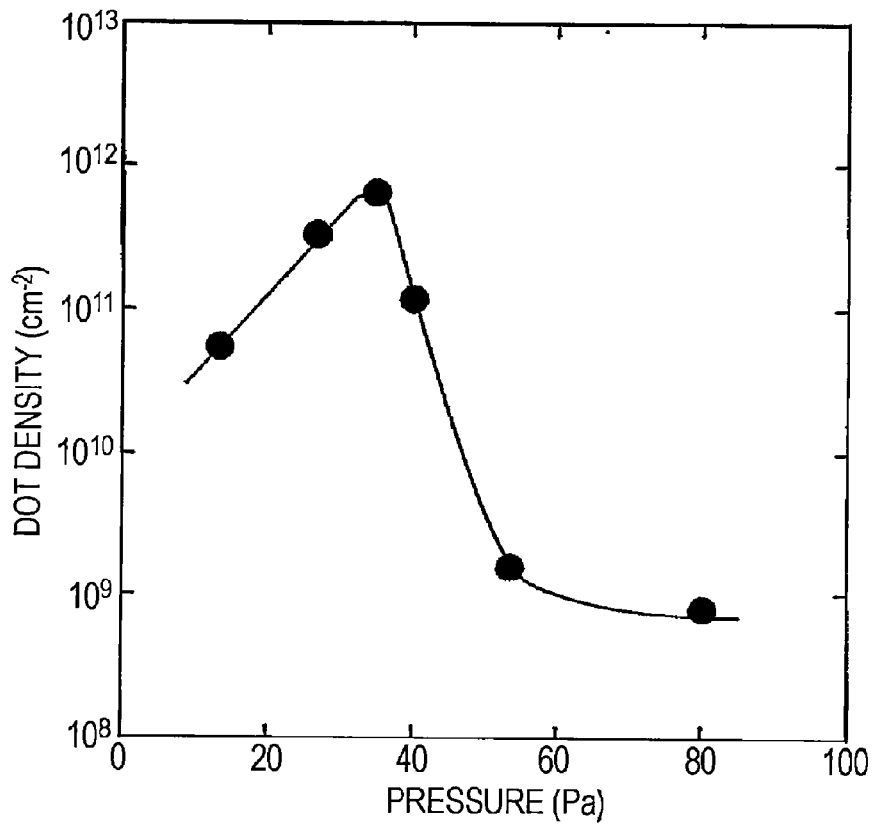
FIG. 17 is a graph showing the relationship between dot density and pressure.

FIG. 17 is a graph showing the relationship between the dot density and the pressure. In FIG. 17, the ordinate axis indicates the dot density and the abscissa axis indicates the pressure. The relationship between the dot density and the pressure shown in FIG. 17 is based on the remote hydrogen plasma treatment where the substrate temperature is set at room temperature, the distance between the antenna 670 and the substrate 700A is set at 23 cm, the VHF power is set at 350 W, and the pressure is changed among 13.3 Pa, 26.6 Pa, 33.3 Pa, 39.9 Pa, 53.2 Pa, and 79.8 Pa.

Referring to FIG. 17, the dot density increases by about one order of magnitude with an increase in the pressure from 13.3 Pa to 33.3 Pa through 26.6 Pa. The highest density ($6.4 \times 10^{11}$ cm$^{-2}$) is obtained at a pressure of 33.3 Pa. The dot density steeply decreases when the pressure increases beyond 33.3 Pa.

As described above, the dot density considerably varies in accordance with the VHF power and the pressure. Therefore, the dot density can be controlled with the VHF power and/or the pressure.

Figure 18A:
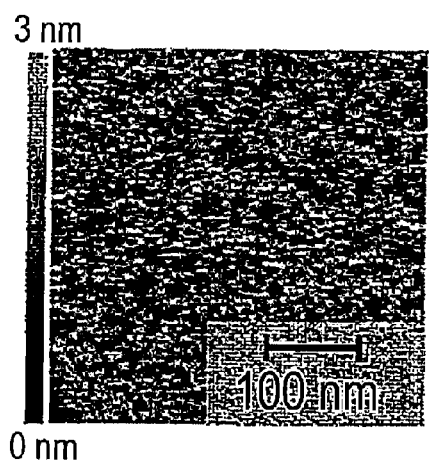
FIG. 18A is a surface shape image and a surface potential image of metal dots.
Figure 18B:
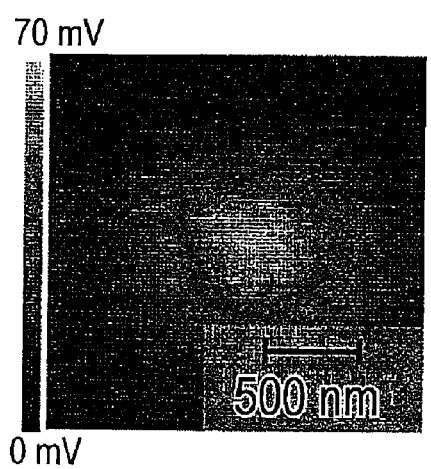
FIG. 18B is a surface shape image and a surface potential image of metal dots.
Figure 18C:
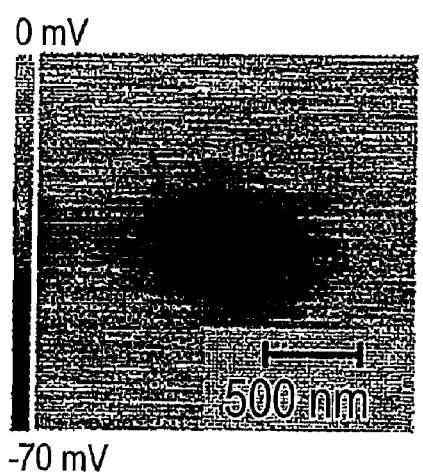
FIG. 18C is a surface shape image and a surface potential image of metal dots.

FIGS. 18A to 18C are a surface shape image and surface potential images of metal dots. FIG. 18A is a surface shape image of Ni dots. FIG. 18B is a surface potential image of a Ni dot after electron emission. FIG. 18C is a surface potential image after electron injection. The distance between the antenna 670 and the substrate 700A in the formation of the Ni dots is 23 cm.

The surface shape image (FIG. 18A) indicates that the size of the Ni dots is substantially uniform. The surface potential image of FIG. 18B shows that only the central portion is white and this indicates that an electron has been emitted. The surface potential image of FIG. 18C shows that only the central portion is black and this indicates that an electron has been injected.

Therefore, Ni dots formed with setting the distance between the antenna 670 and the substrate 700A at 23 cm have substantially uniform size and electrons can be injected to the Ni dots and electrons can be emitted from the Ni dots.

Figure 19:
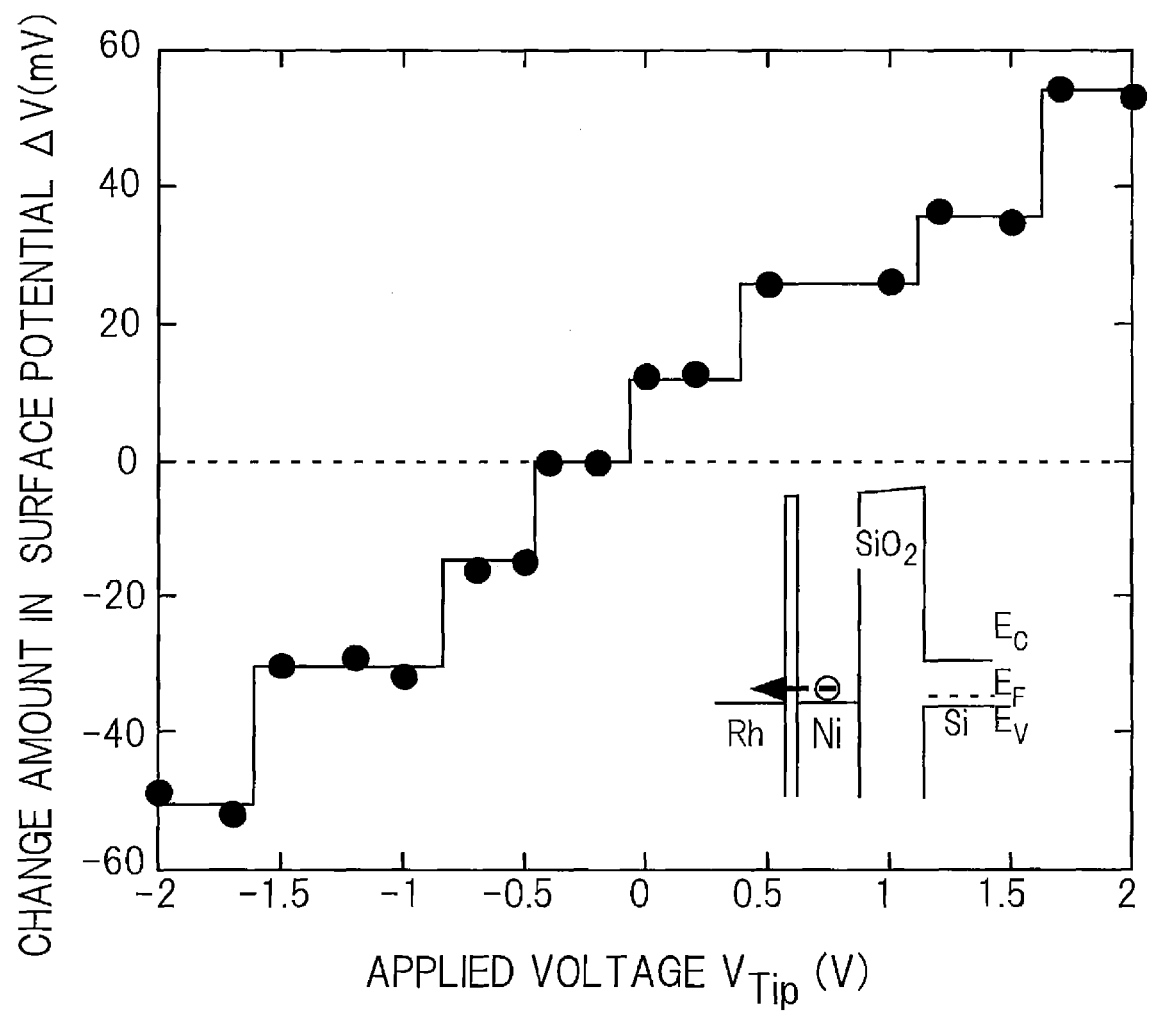
FIG. 19 is a graph showing the relationship between a change amount in surface potential of metal dots and applied voltage.

FIG. 19 is a graph showing the relationship between a change amount in surface potential of metal dots and applied voltage. In FIG. 19, the ordinate axis indicates the change amount in surface potential and the abscissa axis indicates the applied voltage.

Referring to FIG. 19, when the applied voltage is changed in the range of −2 V to +2 V, the change amount in surface potential changes stepwise. The change amount in surface potential in the range of 0 V to −2 V corresponds to injection of electrons into metal dots. The change amount in surface potential in the range of 0 V to +2 V corresponds to emission of electrons from metal dots (that is, injection of holes into metal dots).

The change amount in surface potential changes stepwise in accordance with the applied voltage. This indicates that sub levels are formed in the metal dots 503 (Ni dots) by a quantum size effect and holes and electrons are injected into the thus-formed sub levels. This indicates that Ni dots are electrically isolated from each other and the metal dots 503 can be used as the charge accumulation node 320.

The metal quantum dots 500 produced by the above-described method are used as quantum dots of the charge accumulation node 320 of the semiconductor memory 100, 110. The electron affinity of Ni is higher than the electron affinity of Si constituting the semiconductor substrate 501. For this reason, by using the metal quantum dots 500 as the quantum dots of the charge accumulation node 320, the discrete energy levels LV2 in the charge accumulation node 320 are lower than the discrete energy levels LV1 and LV3 in the control nodes 310 and 410. Thus, electrons can be retained with stability. As a result, the charge accumulation efficiency in the semiconductor memory 100, 110 can be enhanced.

By forming the metal quantum dots 500 constituting the charge accumulation node 320 with setting the distance between the antenna 670 and the substrate 700A at 23 cm, the storage density of the semiconductor memory can be increased.

In the above description, the metal quantum dots 500 are produced by forming the Ni thin film 504 on the SiO2 film 502. However, the present invention is not restricted thereto and the metal quantum dots 500 may be produced by providing Ta and W on the $SiO_2$ film 502. In general, the metal quantum dots 500 may be produced by providing a metal having an electron affinity on the SiO2 film 502, the electron affinity being higher than the electron affinity of a material constituting the semiconductor substrate 501. In this case, in the step (c) shown in FIG. 13, a metal having an electron affinity higher than the electron affinity of a material constituting the semiconductor substrate 501 is deposited on the $SiO_2$ film 502.

In the above description, the remote hydrogen plasma treatment is conducted at room temperature. However, the present invention is not restricted thereto and the remote hydrogen plasma treatment may be conducted at a temperature higher than room temperature, that is, in the heated state. The diameter of the metal dots 503 increases with an increase in the substrate temperature.

In the above description, the metal quantum dots 500 are produced by subjecting the Ni thin film 504 to the remote hydrogen plasma treatment. However, the present invention is not restricted thereto and the metal quantum dots 500 may be produced by heating the Ni thin film 504. In this case, in the step (d) shown in FIG. 13, Ni thin film 504/$SiO_2$ film 502/semiconductor substrate 501 is heated at a temperature of about the melting point of Ni.

[Method for Producing Silicide Dots]

Figure 20:
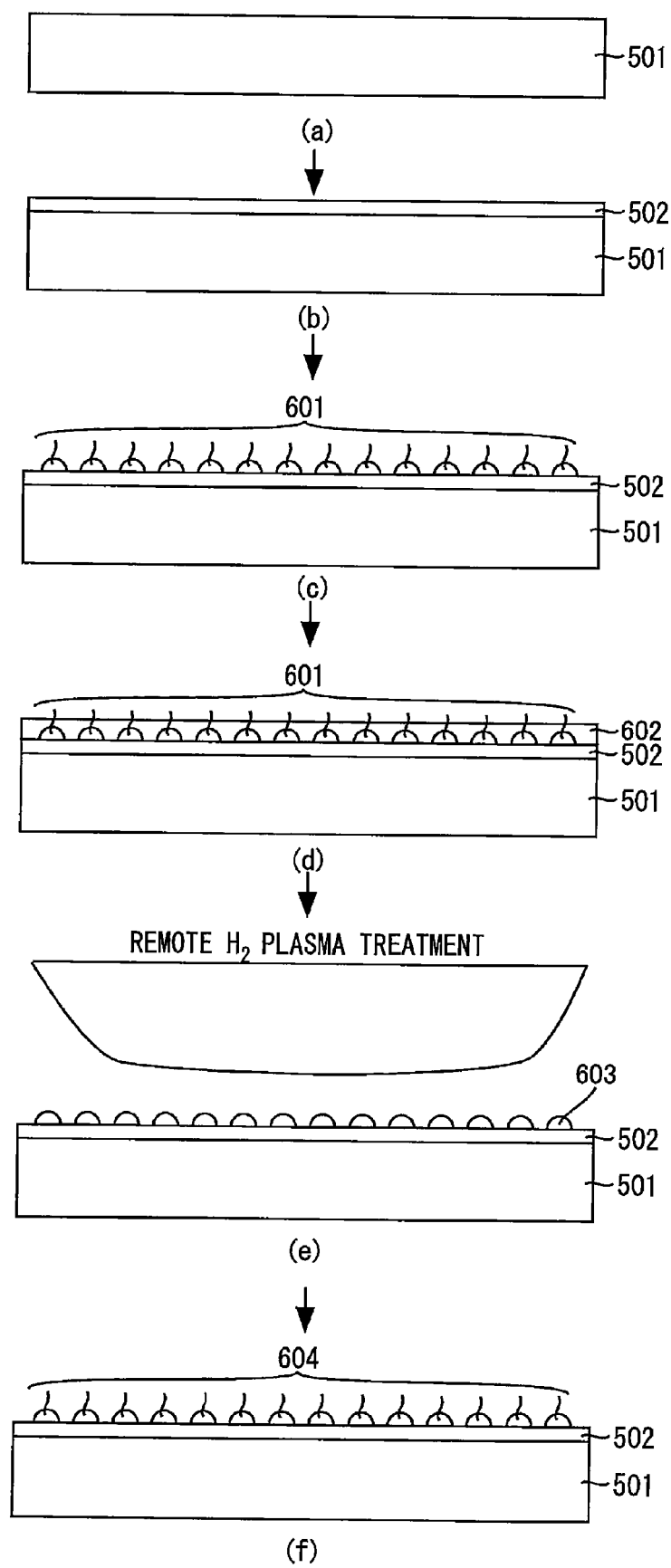
FIG. 20 is a process chart showing a method for producing silicide dots.

FIG. 20 is a process chart showing a method for producing silicide dots. Referring to FIG. 20, when a series of operations is initiated, by the same steps as the steps (a) and (b) shown in FIG. 13, the $SiO_2$ film 502 is formed on a main surface of the semiconductor substrate 501 composed of Si having the (100) plane (see FIGS. 20 (a) and (b)).

The surface of the $SiO_2$ film 502 is then washed with 0.1% hydrofluoric acid. As a result, the surface of the $SiO_2$ film 502 is terminated with OH. After that, quantum dots 601 are formed on the $SiO_2$ film 502 in a self-organizing manner by the LPCVD method with $SiH_4$ gas as a material (see FIG. 20 (c)).

A Ni thin film 602 is then deposited on the quantum dots 601 by an electron-beam evaporation method at a pressure of $2.66 \times 10^{-4}$ Pa (see FIG. 20 (d)). In this case, the Ni thin film 602 has a thickness of 1.8 nm.

After the Ni thin film 602 is formed, the resulting sample of Ni thin film 602/quantum dots 601/$SiO_2$ film 502/semiconductor substrate 501 is placed above the substrate holder 630 of the plasma treatment apparatus 600A. In this case, the semiconductor substrate 501 is not connected to ground potential and is placed above the substrate holder 630 such that the semiconductor substrate 501 is electrically floated.

When the sample of Ni thin film 602/quantum dots 601/$SiO_2$ film 502/semiconductor substrate 501 is placed above the substrate holder 630 of the plasma treatment apparatus 600A, a reaction proceeds between the quantum dots 601 (Si dots) and the Ni thin film 602 and Si-rich silicide dots 603 are formed on the SiO2 film 502 (see FIG. 20 (e)). The sample of quantum dots 603/$SiO_2$ film 502/semiconductor substrate 501 is then subjected to a remote hydrogen plasma treatment with the plasma treatment apparatus 600A by the above-described method (see FIG. 20 (e)). In this case, the remote hydrogen plasma treatment is conducted under the conditions shown in Table 1.

As a result, Si in the Si-rich silicide dots 603 is extracted by atomic hydrogen generated with remote hydrogen plasma and Ni silicide dots 604 are formed on the $SiO_2$ film 502.

Thus, the operations for producing the silicide dots are complete.

Figure 21:
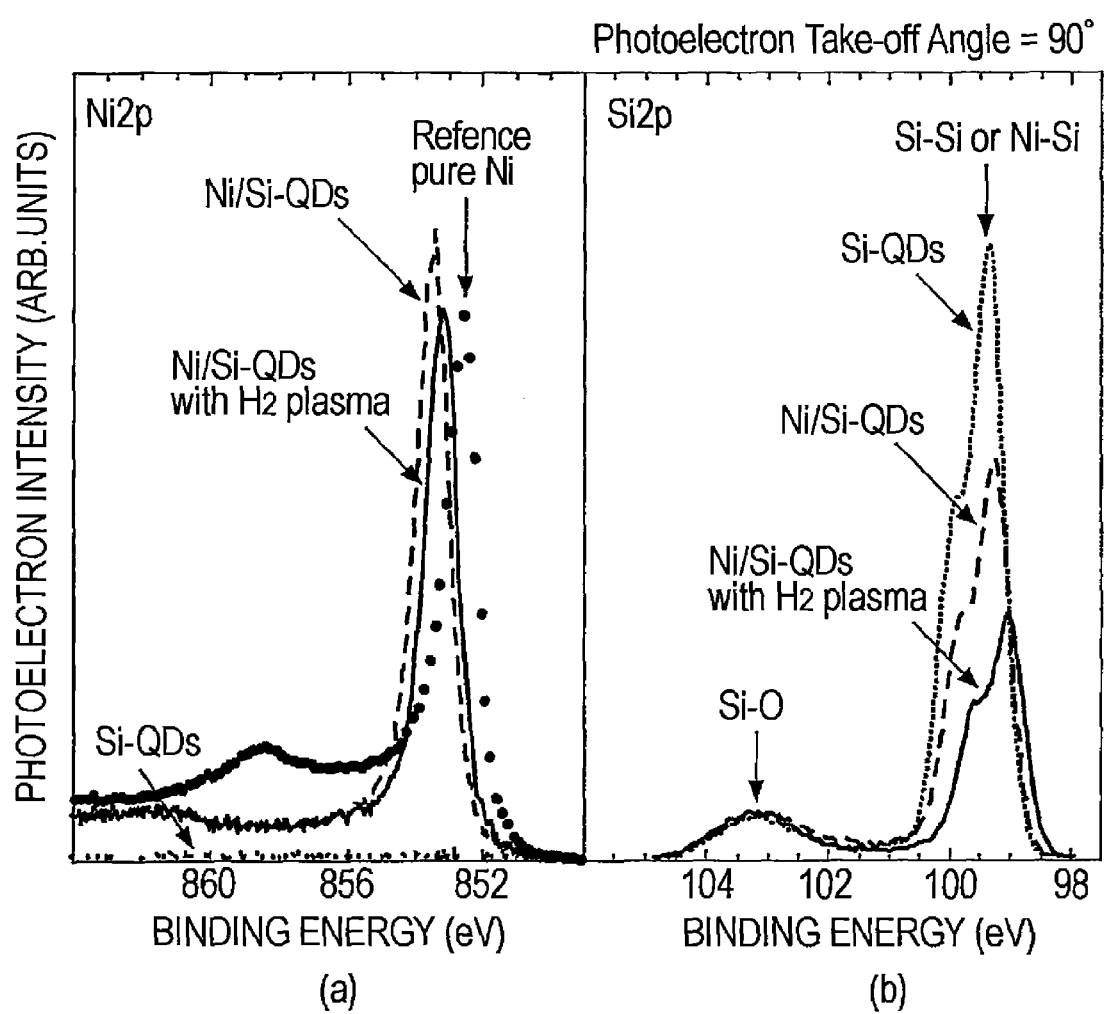
FIG. 21 shows XPS (X-ray photoelectron spectroscopy) spectra.

FIG. 21 shows XPS (X-ray photoelectron spectroscopy) spectra. In FIG. 21, the ordinate axis indicates photoelectron intensity and the abscissa axis indicates binding energy. FIG. 21 (a) shows spectra of Ni2p and FIG. 21 (b) shows spectra of Si2p. "Si-QDs" represents Si dots. "Ni/Si-QDs" represents Si dots having a Ni thin film formed thereon. "Ni/Si-QDs with $H_2$ plasma" represents Si dots having a Ni thin film formed thereon and subsequently treated with remote hydrogen plasma.

Referring to FIG. 21, by conducting the treatment with the remote hydrogen plasma, the peak of Ni2p is shifted to the side of the peak of Ni2p of a pure Ni thin film; and the peak of Si2p is shifted in the direction away from the peaks representing Si—Si bond or Ni—Si and the intensity of the peak decreases.

Thus, XPS spectra shown in FIG. 21 indicate that the remote hydrogen plasma treatment reduces Si in Ni/Si-QDs and the silicide dots that are obtained by extracting Si from Si-rich silicide dots are formed.

Si-rich silicide dots contain more Si than silicide dots. For this reason, the electron affinity of the Si-rich silicide dots is lower than the electron affinity of silicide dots.

Accordingly, Si-rich silicide dots can be converted into silicide dots by conducting a remote hydrogen plasma treatment. Thus, by conducting a remote hydrogen plasma treatment, silicide dots having increased electron affinity can be formed. As a result, electrons can be retained with stability by using silicide dots formed by a remote hydrogen plasma treatment for the charge accumulation node 320 of a semiconductor memory.

The electron affinity of silicide dots can be controlled by using a remote hydrogen plasma treatment.

Therefore, by forming silicide dots in accordance with the steps (a) to (f) in FIG. 20, silicide dots having relatively high electron affinity can be formed. The electron affinity of silicide dots can be controlled by using the steps (a) to (f) in FIG. 20.

As described above, according to the present invention, a remote hydrogen plasma treatment can be used for forming the metal dots 503 and controlling the electron affinity of silicide dots.

In the step (d) in FIG. 20, the metal to be deposited on the quantum dots 601 is not restricted to Ni and the metal may be Ta, W, or the like. In general, the metal should be a metal having an electron affinity higher than the electron affinity of Si, which is the material of the semiconductor substrate 501.

APPLICATION EXAMPLE

Figure 22:
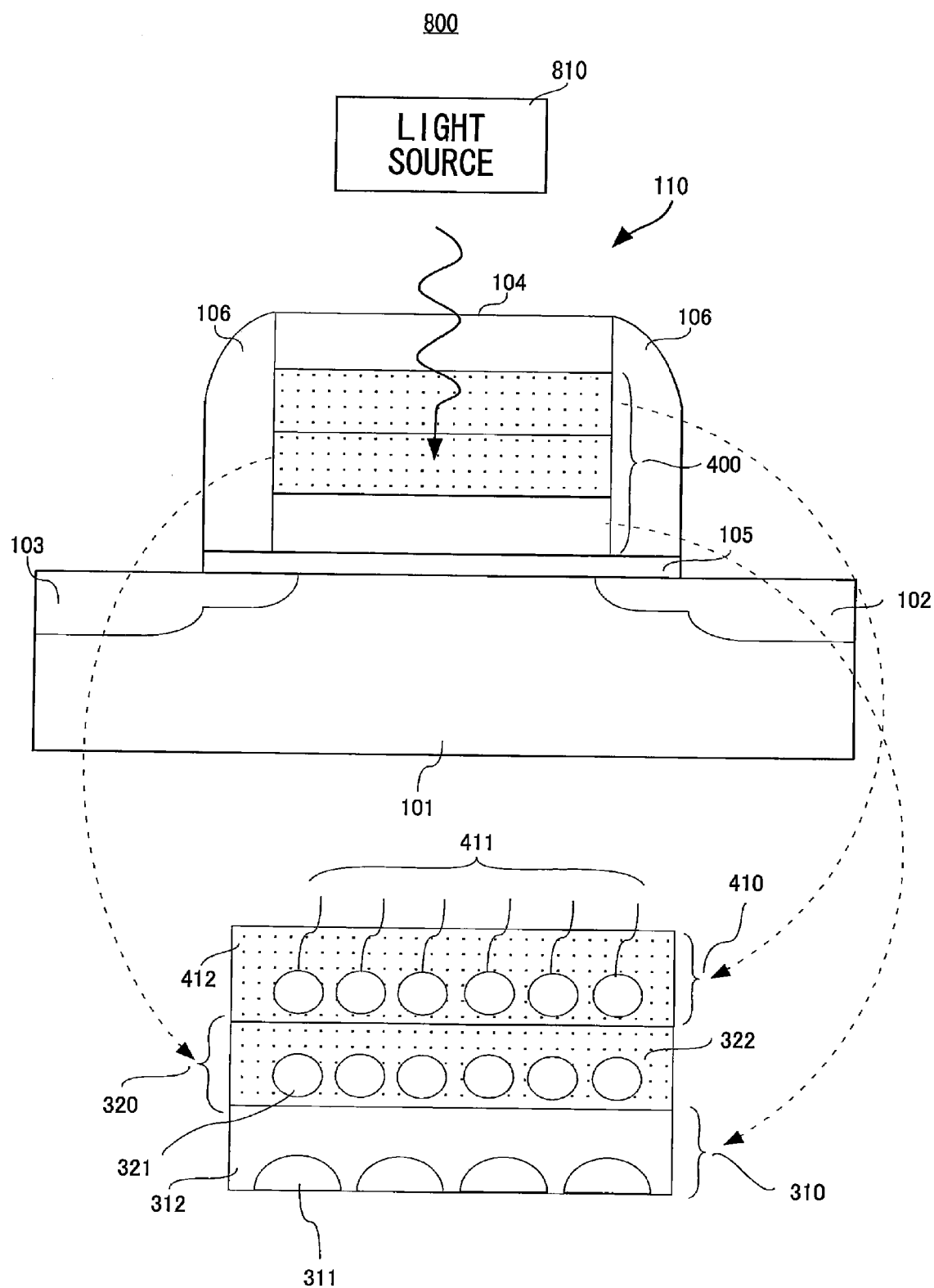
FIG. 22 is a schematic view of a semiconductor memory system using a semiconductor memory according to the present invention.

FIG. 22 is a schematic view of a semiconductor memory system using a semiconductor memory according to the present invention. Referring to FIG. 22, a semiconductor memory system 800 includes the semiconductor memory 110 and a light source 810.

In the semiconductor memory system 800, the gate electrode 104 of the semiconductor memory 110 is a transparent gate electrode composed of ITO, IZO, or the like.

The light source 810 irradiates the weak light 900 from the gate electrode 104 side to the semiconductor memory 110. This causes excitation of electrons retained in the charge accumulation node 320 of the semiconductor memory 110 and the electrons are emitted to the control node 410 or the semiconductor substrate 101. Thus, memory erasure is conducted in the semiconductor memory 110.

The semiconductor memory system 800 may include the semiconductor memory 100 instead of the semiconductor memory 110. In this case, the gate electrode 104 is also a transparent gate electrode composed of ITO, ZnO, or the like.

In the above description, the semiconductor substrate 101 is constituted by an n-type single crystal Si substrate. However, the present invention is not restricted thereto and the semiconductor substrate 101 should be constituted by a single crystal semiconductor substrate, a compound semiconductor substrate, a single crystal semiconductor thin film formed on an insulator (SOI: silicon on insulator), a compound semiconductor thin film, a polycrystalline semiconductor formed on an insulator, a polycrystalline compound semiconductor thin film, or the like.

In the above description, the quantum dots 311 are composed of Si crystals. However, the present invention is not restricted thereto and the quantum dots 311 may be composed of Ge crystals, Si crystals or Ge crystals doped with phosphorus (P) or boron (B), or Ge cores covered with Si. When P or B is added, the quantum dots 311 doped with P or B are formed by pulse addition of a small amount of 1% phosphine ($PH_3$) or diborane ($B_2H_6$) diluted with helium (He) in formation of the quantum dots 311 by the LPCVD method. This is described in detail in K. Makihara et al., Abst of IUMRS-ICA-2006 (2006) p. 82. Formation of Si quantum dots containing Ge cores is described in Y. Darma et al., Appl. Surf. Sci., Vol. 224 (2004) pp. 156-159.

In the above description, the high dielectric insulation film 322 and the high dielectric insulation film 412 are composed of a Ta oxide film or a Zr oxide film. However, the present invention is not restricted thereto and the high dielectric insulation film 322 and the high dielectric insulation film 412 may be composed of an aluminum oxide film (Al oxide film), an yttrium oxide film (Y oxide film), a hafnium oxide film (Hf oxide film), or a lanthanum oxide film (La oxide film).

In the present invention, the quantum dots 321 constitute the "first quantum dots" and the quantum dots 311 constitute the "second quantum dots".

The high dielectric insulation film 322 constitutes the "first coating material" and the Si oxide film 312 constitutes the "second coating material".

The control node 310 constitutes the "first control node" and the control node 410 constitutes the "second control node".

The energy levels LV2 constitute the "first energy levels" and the energy levels LV1 and/or the energy levels LV3 constitute the "second energy levels".

It should be understood that the embodiments that have been disclosed so far are mere examples in all respects and not limitative. The scope of the present invention is defined not by the above description of the embodiments but by CLAIMS. The present invention is intended to embrace all variations that are equivalent to and fall within the scope of CLAIMS.

INDUSTRIAL APPLICABILITY

The present invention is applied to a semiconductor memory having a configuration of a composite floating gate having good charge accumulation efficiency. The present invention is also applied to a semiconductor memory system using a semiconductor memory having a configuration of a composite floating gate having good charge accumulation efficiency. The present invention is also applied to a method for producing quantum dots used for a semiconductor memory having a configuration of a composite floating gate having good charge accumulation efficiency. The present invention is also applied to a method for producing quantum dots, the method being capable of producing metal quantum dots by simple processes.

The invention claimed is:

1. A semiconductor memory including a floating gate structure, comprising:
   a charge accumulation node including first quantum dots and accumulating electrons; and
   a control node including second quantum dots and performing injection of the electrons into and/or emission of the electrons from the charge accumulation node,
   wherein the charge accumulation node is composed of a material different from a material of the control node such that energy levels of the first quantum dots for the electrons are lower than energy levels of the second quantum dots for the electrons,
   the control node includes first and second control nodes, and
   the charge accumulation node is provided between the first control node and the second control node.

2. The semiconductor memory according to claim 1,
   wherein the charge accumulation node includes the first quantum dots and a first coating material covering the first quantum dots;
   the control node includes the second quantum dots and a second coating material covering the second quantum dots;
   the first quantum dots are composed of a material different from a material of the second quantum dots; and
   the first coating material is composed of a material different from a material of the second coating material.

3. The semiconductor memory according to claim 2,
   wherein the first quantum dots include Si—Ge-based quantum dots, and
   the second quantum dots include metal silicide quantum dots.

4. The semiconductor memory according to claim 2,
   wherein the first quantum dots include metal quantum dots, and
   the second quantum dots include metal silicide quantum dots.

5. The semiconductor memory according to claim 4, wherein the metal quantum dots are composed of a metal having an electron affinity higher than an electron affinity of a semiconductor substrate on which the charge accumulation node and the control node are formed.

6. A semiconductor memory system comprising:
   a semiconductor memory including a floating gate structure; and
   a light source irradiating light to the semiconductor memory;

wherein the semiconductor memory includes:
a floating gate including a charge accumulation node having first quantum dots and accumulating electrons; and a control node having second quantum dots and performing injection of the electrons into and/or emission of the electrons from the charge accumulation node, and
a light-transmissive gate electrode guiding light from the light source to the charge accumulation node,
wherein the charge accumulation node is composed of a material different from a material of the control node such that energy levels of the first quantum dots for the electrons are lower than energy levels of the second quantum dots for the electrons,
the control node includes first and second control nodes, and
the charge accumulation node is provided between the first control node and the second control node.

7. A method for producing a semiconductor memory including a floating gate structure, the method comprising:
a first step of forming a charge accumulation node including first quantum dots and accumulating electrons; and
a second step of forming a control node including second quantum dots and performing injection of the electrons into and/or emission of the electrons from the charge accumulation node,
wherein the charge accumulation node is composed of a material different from a material of the control node such that energy levels of the first quantum dots for the electrons are lower than energy levels of the second quantum dots for the electrons,
the control node includes first and second control nodes, and
the charge accumulation node is provided between the first control node and the second control node.

8. The method for producing the semiconductor memory according to claim 7, wherein, the charge accumulation node includes the first quantum dots and a first coating material covering the first quantum dots;
the control node includes the second quantum dots and a second coating material covering the second quantum dots;
the first quantum dots are composed of a material different from a material of the second quantum dots; and
the first coating material is composed of a material different from a material of the second coating material.

9. The method for producing the semiconductor memory according to claim 8,
wherein the first quantum dots include Si—Ge-based quantum dots, and
the second quantum dots include metal silicide quantum dots.

10. The method for producing the semiconductor memory according to claim 8,
wherein the first quantum dots include metal quantum dots, and
the second quantum dots include metal silicide quantum dots.

11. The method for producing the semiconductor memory according to claim 10, wherein the metal quantum dots are composed of a metal having an electron affinity higher than an electron affinity of a semiconductor substrate on which the charge accumulation node and the control node are formed.

* * * * *

UNITED STATES PATENT AND TRADEMARK OFFICE
CERTIFICATE OF CORRECTION

| | |
|---|---|
| PATENT NO. | : 7,898,020 B2 |
| APPLICATION NO. | : 12/523682 |
| DATED | : March 1, 2011 |
| INVENTOR(S) | : Makihara et al. |

It is certified that error appears in the above-identified patent and that said Letters Patent is hereby corrected as shown below:

In Fig. 21, Sheet 16 of 17, delete "Refence" and insert -- Reference --, therefor.

In Column 6, Line 31, delete "plane 103" and insert -- plane --, therefor.

In Column 6, Line 32, delete "electrode" and insert -- electrode 103 --, therefor.

In Column 17, Line 15, delete "SiO2" and insert -- $SiO_2$ --, therefor.

In Column 17, Line 20, delete "SiO2" and insert -- $SiO_2$ --, therefor.

In Column 18, Line 4, delete "SiO2" and insert -- $SiO_2$ --, therefor.

In Column 20, Line 62, in Claim 5, delete "arc" and insert -- are --, therefor.

Signed and Sealed this
First Day of May, 2012

David J. Kappos
*Director of the United States Patent and Trademark Office*